(12) United States Patent
Gadigatla et al.

(10) Patent No.: US 11,682,664 B2
(45) Date of Patent: Jun. 20, 2023

(54) STANDARD CELL ARCHITECTURE WITH POWER TRACKS COMPLETELY INSIDE A CELL

(71) Applicant: Intel Corporation, Santa Clara, CA (US)

(72) Inventors: Srinivasa Chaitanya Gadigatla, Hillsboro, OR (US); Ranjith Kumar, Beaverton, OR (US); Marni Nabors, Portland, OR (US); Quan Phan, Happy Valley, OR (US)

(73) Assignee: Intel Corporation, Santa Clara, CA (US)

( * ) Notice: Subject to any disclaimer, the term of this patent is extended or adjusted under 35 U.S.C. 154(b) by 854 days.

(21) Appl. No.: 16/263,093

(22) Filed: Jan. 31, 2019

(65) Prior Publication Data

US 2020/0251464 A1    Aug. 6, 2020

(51) Int. Cl.
*H01L 27/02* (2006.01)
*H01L 23/528* (2006.01)
*H01L 27/118* (2006.01)
*G06F 30/394* (2020.01)

(52) U.S. Cl.
CPC ...... *H01L 27/0207* (2013.01); *H01L 23/5286* (2013.01); *H01L 27/11803* (2013.01); *G06F 30/394* (2020.01)

(58) Field of Classification Search
CPC ............ H01L 27/0207; H01L 23/5286; H01L 27/11803; H01L 2027/11881; H01L 2224/16225; H01L 2924/15311; H01L 27/11807; H01L 21/76805; H01L 21/76895; H01L 23/481; G06F 30/394
USPC ........................................................ 257/207
See application file for complete search history.

(56) References Cited

U.S. PATENT DOCUMENTS

| | | | |
|---|---|---|---|
| 9,502,351 B1 * | 11/2016 | Sahu ................. | H01L 27/11807 |
| 2002/0013931 A1 * | 1/2002 | Cano ................... | H01L 23/5286 |
| | | | 257/E23.153 |
| 2008/0111158 A1 * | 5/2008 | Sherlekar ............ | G06F 30/392 |
| | | | 716/112 |
| 2009/0315079 A1 | 12/2009 | Li-Chen | |
| 2012/0249182 A1 * | 10/2012 | Sherlekar ............ | G06F 30/394 |
| | | | 716/102 |
| 2018/0090440 A1 * | 3/2018 | Schultz ................ | G06F 30/392 |
| 2020/0279069 A1 * | 9/2020 | Kumar ................... | H01L 23/50 |

OTHER PUBLICATIONS

Search Report from European Patent Application No. 19199482.1, dated Mar. 17, 2020, 6 pgs.
Office Action from European Patent Application No. 19199482.1, dated Feb. 14, 2023, 5 pgs.

* cited by examiner

*Primary Examiner* — Duy T Nguyen
(74) *Attorney, Agent, or Firm* — Schwabe, Williamson & Wyatt P.C.

(57) ABSTRACT

An integrated circuit structure includes a cell on a metal level, the cell defined by a cell boundary. A plurality of substantially parallel interconnect lines are inside the cell boundary. A first power track and a second power track are both dedicated to power and are located completely inside the cell boundary without any power tracks along the cell boundary on the metal level.

25 Claims, 21 Drawing Sheets

STANDARD CELL ARCHITECTURE WITH POWER TRACKS COMPLETELY INSIDE A CELL

TECHNICAL FIELD

Embodiments of the disclosure are in the field of integrated circuit structures and, in particular, a standard cell architecture with power tracks completely inside a cell.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips.

For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant. Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

Variability in conventional and state-of-the-art fabrication processes may limit the possibility to further extend them into the, e.g. 10 nm or sub-10 nm range. Consequently, fabrication of the functional components needed for future technology nodes may require the introduction of new methodologies or the integration of new technologies in current fabrication processes or in place of current fabrication processes. New layouts may be introduced either to accommodate or to enable such future technology nodes.

DESCRIPTION OF THE EMBODIMENTS

Figure 1:
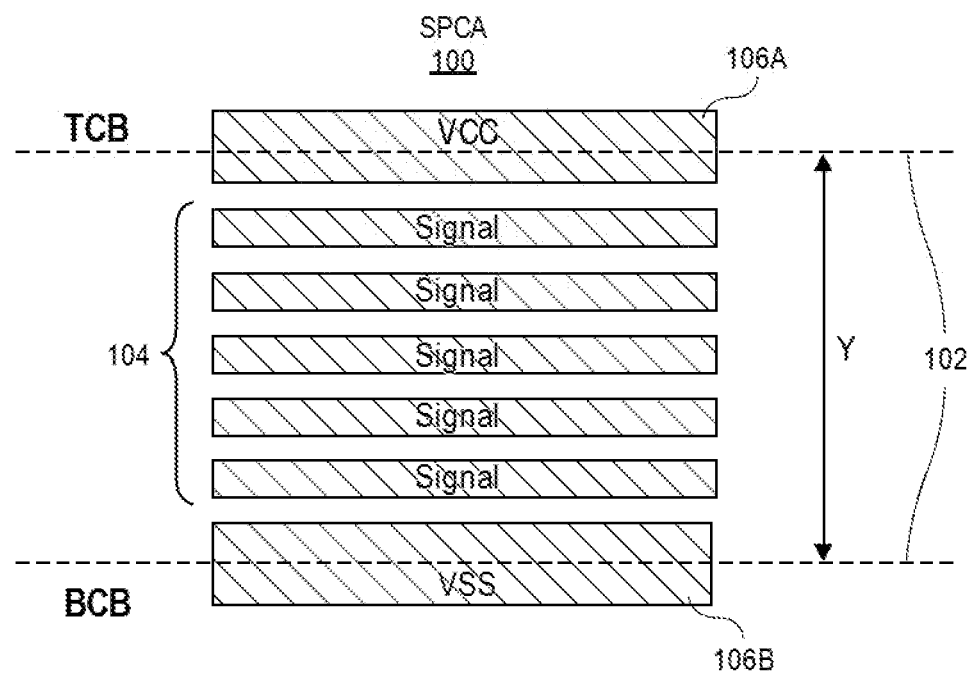
FIG. 1 illustrates a physical implementation of an example cell layout with shared power tracks (Vcc/Vss).

A standard cell architecture with power tracks completely inside a cell is described for improved cell performance. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to a standard cell architecture defined by library cell designs to have an inside power cell architecture where both power tracks and power trench contacts are entirely inside a cell boundary in an integrated circuit. In one embodiment, a power track is a fixed location where a power supply for a library cell originates. More specifically, an integrated circuit is disclosed comprising a cell on a metal level, wherein the cell defined by a cell boundary. A plurality of substantially parallel interconnect lines are inside the cell boundary. A first power track and a second power track are both dedicated to power and located completely inside the cell boundary without any power tracks along the cell boundary on the metal level. The cell may further include block-level routing interconnects along opposite sides of the cell boundary on the metal level. Embodiments may be directed to 10 nanometer or smaller technology nodes. Embodiments may include or be directed to cell layouts that make possible higher performance cells in a same or smaller footprint relative to a previous technology node.

A standard cell is a logic module that implements a simple function and has a predesigned internal layout. A cell library defines cells available for use in physical implementations using a particular technology node and specifies characteristics of those cells. The cell library typically includes standard cell layouts of different sizes. In integrated circuit designs, standard cells are placed over a substrate as building blocks for a circuit being implemented on various layers or levels such as, for example, Poly/device, metal 0 (M0), metal 1 (M1), metal 2 (M2), metal 3 (M3), and so on. In one embodiment, cells are described herein that exist primarily on M0 as an example. However, in other embodiments, the cells may exist on any of the metal levels, meaning that any cell design shown for M0 can be done on any other metal level.

The automatic placement and routing of cells to form blocks is an important aspect of modern very large-scale integration (VLSI) devices. During placement, a placement tool accesses the cell layouts from a cell library and places the cells in rows. A collection of cells may form a block. A router tool then creates connections between the cells at a block level by routing in available metal layers. Typically, cells are designed to use as few routing layers as possible so that higher level routing can be performed over the top of the cells for inter-cell routing. For example, Poly/M0/M1 are used for cell levels, while upper levels, e.g., M2-M6, are used for inter-cell routing at block-level. The block-to-block boundary can change for each foundry/technology.

For context, FIG. 1 illustrates a physical implementation of an example cell layout with shared power tracks (Vcc/Vss) in a Shared Power Cell Architecture (SPCA). FIG. 1 illustrates a M0 level structure for SPCA cell 100. Cell 100 is defined by a cell boundary 102 and comprises a plurality of substantially parallel interconnect lines 104 referred to herein as signal tracks along a first direction, input pins and/or output pins. FIG. 1 shows that on the M0 level, the cell 100 typically includes a set of power tracks 106A and 106B along a top cell boundary (TCB) and a bottom cell boundary (BCB) for Vcc and Vss, respectively. The distance between the TCB and BCB defines a cell height (Y) for the cell. In an SPCA cell, the power tracks 106A and 106B (collectively referred to as power tracks 106) along the TCB and BCB are typically shared between adjacent cells to obtain the best usage for signal tracks 104.

Figure 2:
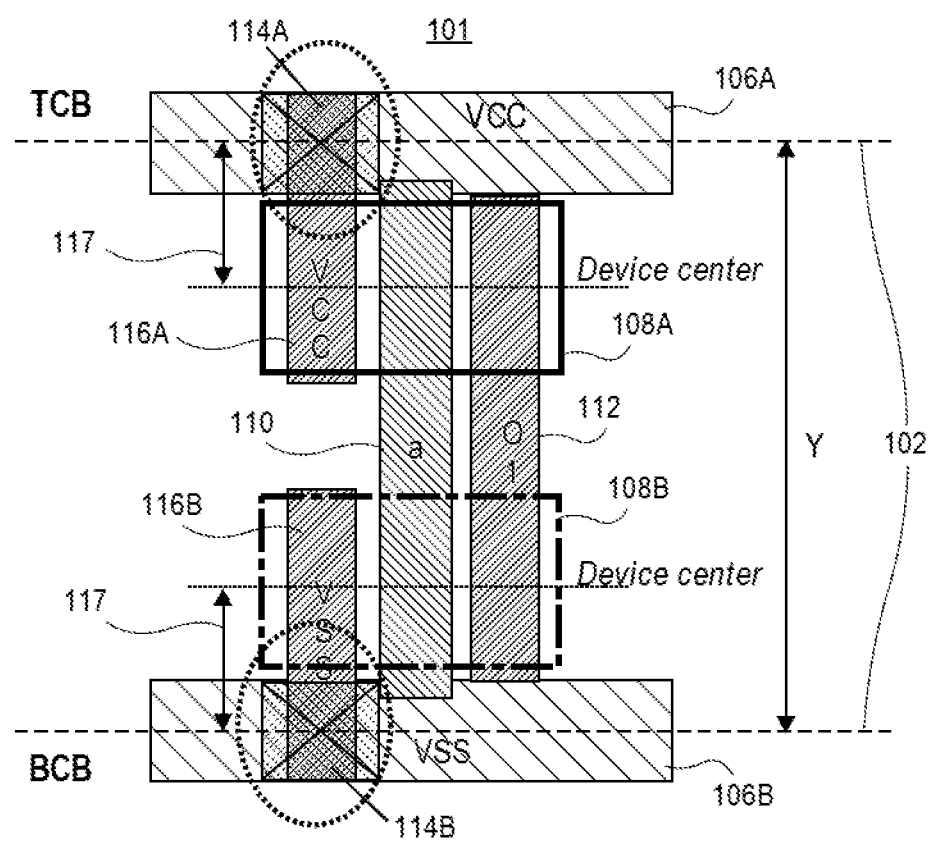
FIG. 2 illustrates an example inverter layout in a SPCA cell showing components in a device or Poly level and the M0 level for SPCA cell.

FIG. 2 illustrates an example inverter layout in a SPCA cell 101 showing components in a device or Poly level and the M0 level for SPCA cell 101. Two devices 108a and 108B (collectively referred to as devices 108) are shown within the cell boundary 102 on the device level below the M0 level. A poly gate 110 and a signal trench contact (TCN) 112 are shown extending across the two devices 108 in a direction generally orthogonal to the power tracks 106.

Power tracks 106 supply power to the devices 108 through power via contacts (VCT) 114A and 114B and corresponding power trench contacts (TCN) 116A and 116B, respectively. The power via contacts (VCT) 114A and 114B (collectively referred to as power VCTs) are small openings through one or more adjacent levels to provide a conductive connection. The power VCTs 114 may be located on a via level between the device level and M0 to connect the devices 108 to the power tracks 106 on M0 through the power trench contacts (TCN) 116A and 116B (collectively referred to as power TCNs) on the device level. As the power VCTs 114 must be located beneath power tracks 106, and the devices 108 are located within the cell boundary 102, the VCTs 114 cannot land directly over the devices 108. This scenario is not ideal for cell performance as current has to travel an extra distance 117 from centers of the VCTs 114 to centers of the device 108 through the power TCNs 116, which leads to increased resistance.

Figure 3:
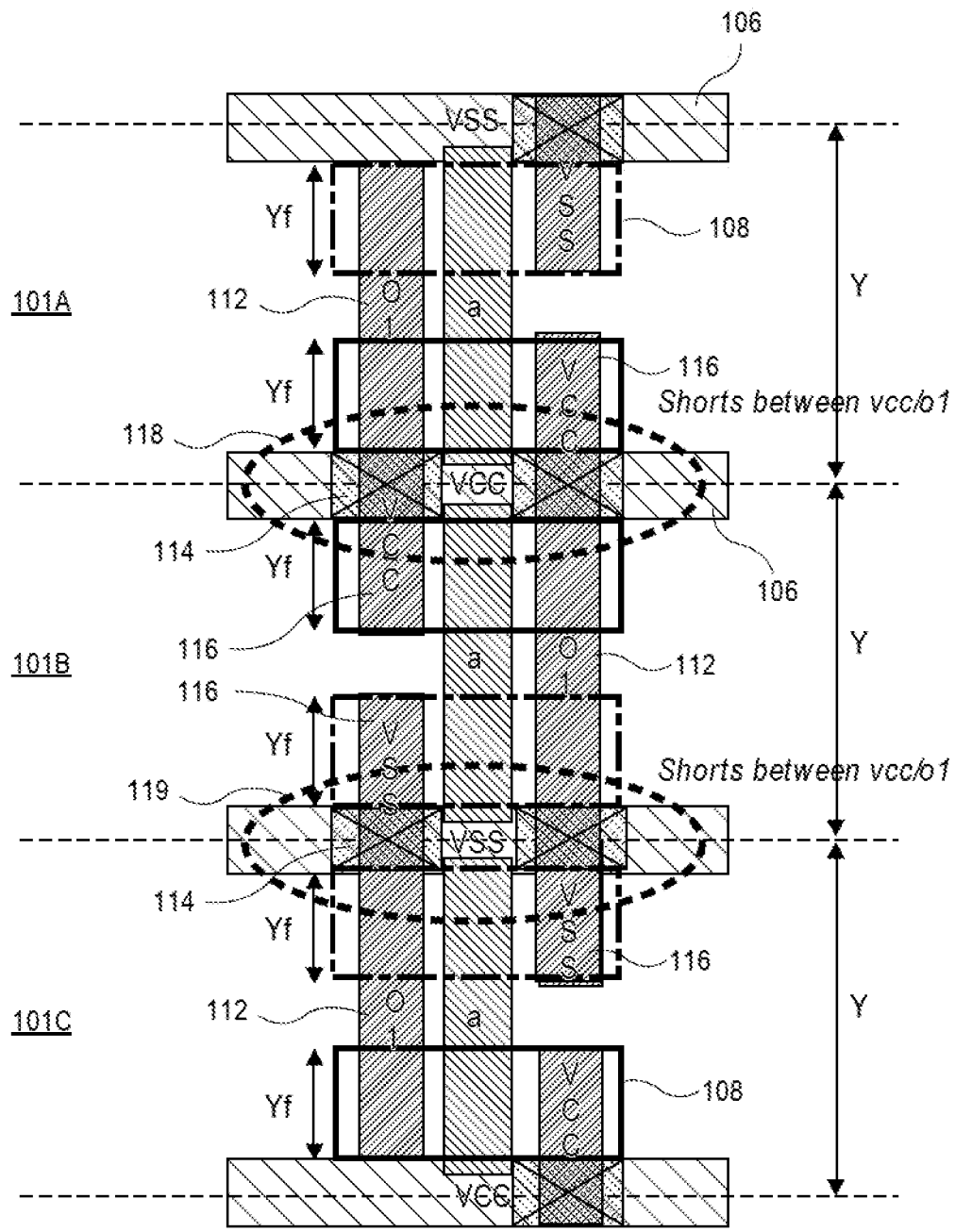
FIG. 3 illustrates an example layout of a column of SPCA cells having maximum device size of Yf and power track and power TCNs connections across top/bottom cell boundaries in the column.

In integrated circuit designs, cells are arranged in a grid in which devices, such as transistors, are arranged in rows and columns, as shown in FIG. 3.

FIG. 3 illustrates an example layout of a column of SPCA cells 101A-101C having maximum device size of Yf and power track and power TCNs connections across top/bottom cell boundaries in the column. The layout of two adjacent SPCA cells 101A-101C are inverted about their x- and y-axis and share top/bottom cell boundaries 102. In SPCA, if the maximum device size of the devices packed in a cell is Yf, and if such a cell is abutted with itself across top/bottom cell boundaries, it will lead to shorts between the power TCNs 116 and signal TCNs 112 where contact is made under the VCTs 114. As an example, dashed circle 118 shows that at the cell boundary between cell 101A and cell 101B, a short exists between Vcc in cell 101B and signal TCN 112 in cell 101A. Dashed circle 119 shows that at the cell boundary between cell 101B and cell 101C, a short exists between Vss in cell 101B and signal TCN 112 in cell 101C. The shorts happen because the power TCNs 116 must extend outside the top/bottom cell boundaries 102 to provide proper landing for the power VCTs 114, and those extensions create a short to the signal TCNs 112 (over the device) coming from abutting cells.

Figure 4:
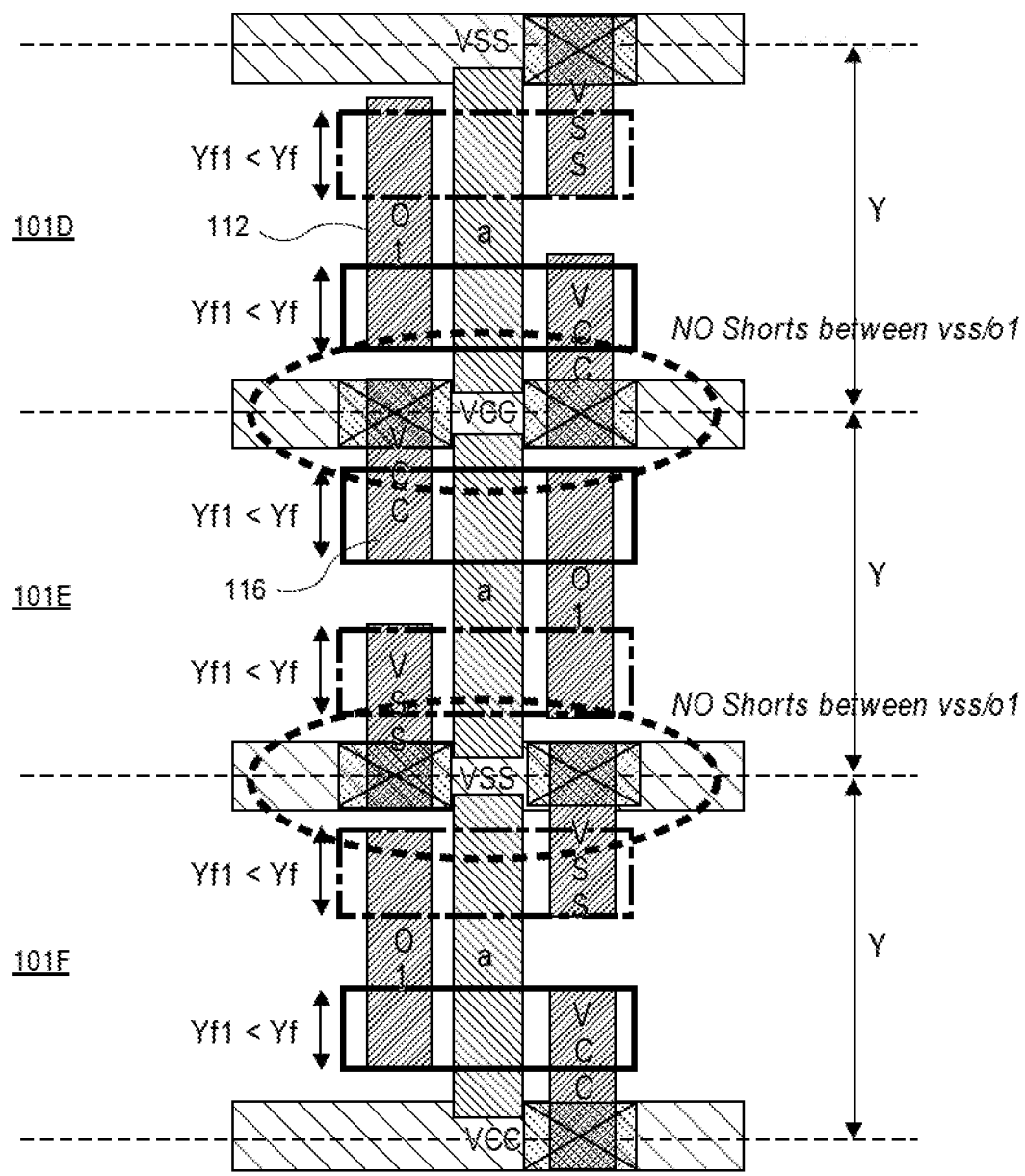
FIG. 4 illustrates an example layout of a column of SPCA cells having reduced maximum device size Yf1.

In one embodiment, the above-mentioned shorts problem can be avoided by reducing the maximum device size from Yf to Yf1, where Yf1<Yf, and packing the smaller devices into the standard cell height Y, as shown in FIG. 4.

FIG. 4 illustrates an example layout of a column of SPCA cells 101D-101F having reduced maximum device size Yf1. As shown, once the maximum device size is reduced to Yf1, there are no shorts between the signal TCNs 112 and power TCNs 116 across the top/bottom cell boundaries 102 in SPCA. However, one problem with SPCA cells 101D-101F with reduced maximum device size Yf1 is that the amount of drive (which is proportional to the device sizes) possible with a given cell height Y is reduced. Consequently, this embodiment, is also not ideal for overall cell performance.

To summarize, SPCA cells have three different problems, namely cell performance loss, shorts and reduced drive. There are three solutions to address these problems, but these solutions only partially solve the problems or introduce new complications.

Solution 1

Figure 5:
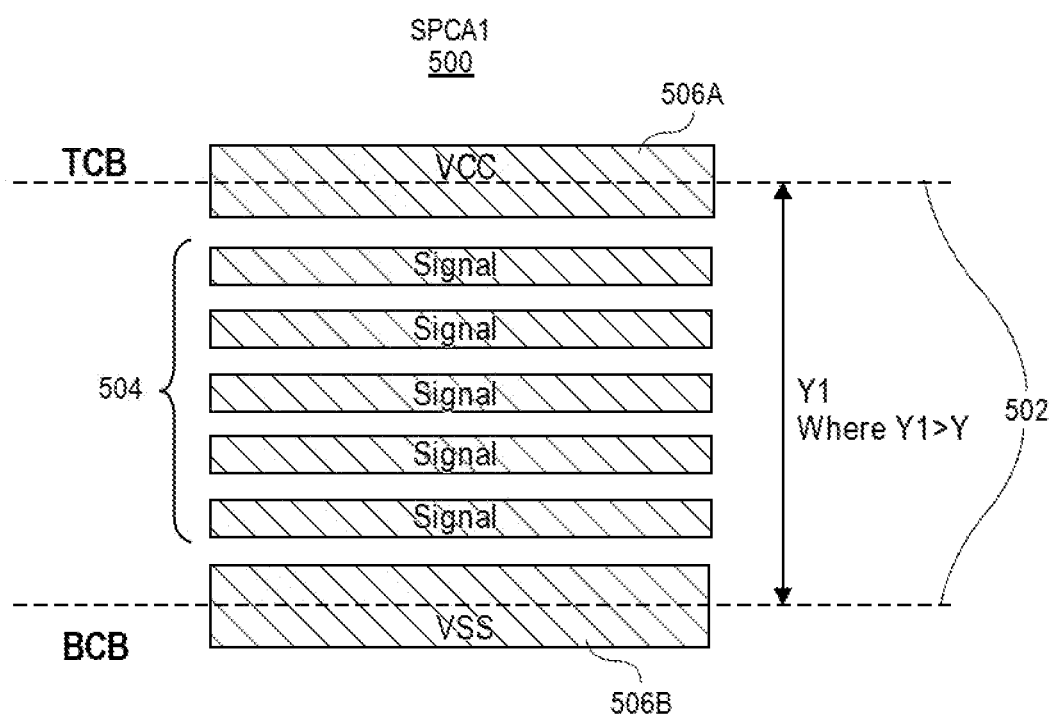
FIG. 5 illustrates a SPCA1 cell layout with shared power tracks (Vcc/Vss) having increased cell height Y1 compared to the SPCA.

Solution 1 defines an SPCA having increased cell height, which is referred to herein as SPCA1, as shown in FIG. 5.

FIG. 5 illustrates a SPCA1 cell layout with shared power tracks (Vcc/Vss) having increased cell height Y1, where Y1>Y compared to the SPCA. An SPCA1 cell 500 is defined by a cell boundary 502. On the M0 level, the SPCA1 cell 500 includes a plurality of substantially parallel interconnect lines 504 or signal tracks, and a set of power tracks 506A and 506B (collectively referred to as power tracks 506) along the top cell boundary (TCB) and bottom cell boundary (BCB) 502 for Vcc and Vss, respectively. The distance between the TCB and BCB defines a cell height (Y1) for the cell 500, which is greater than cell height Y of the SPCA cell architecture shown in FIGS. 1-4.

Figure 6:
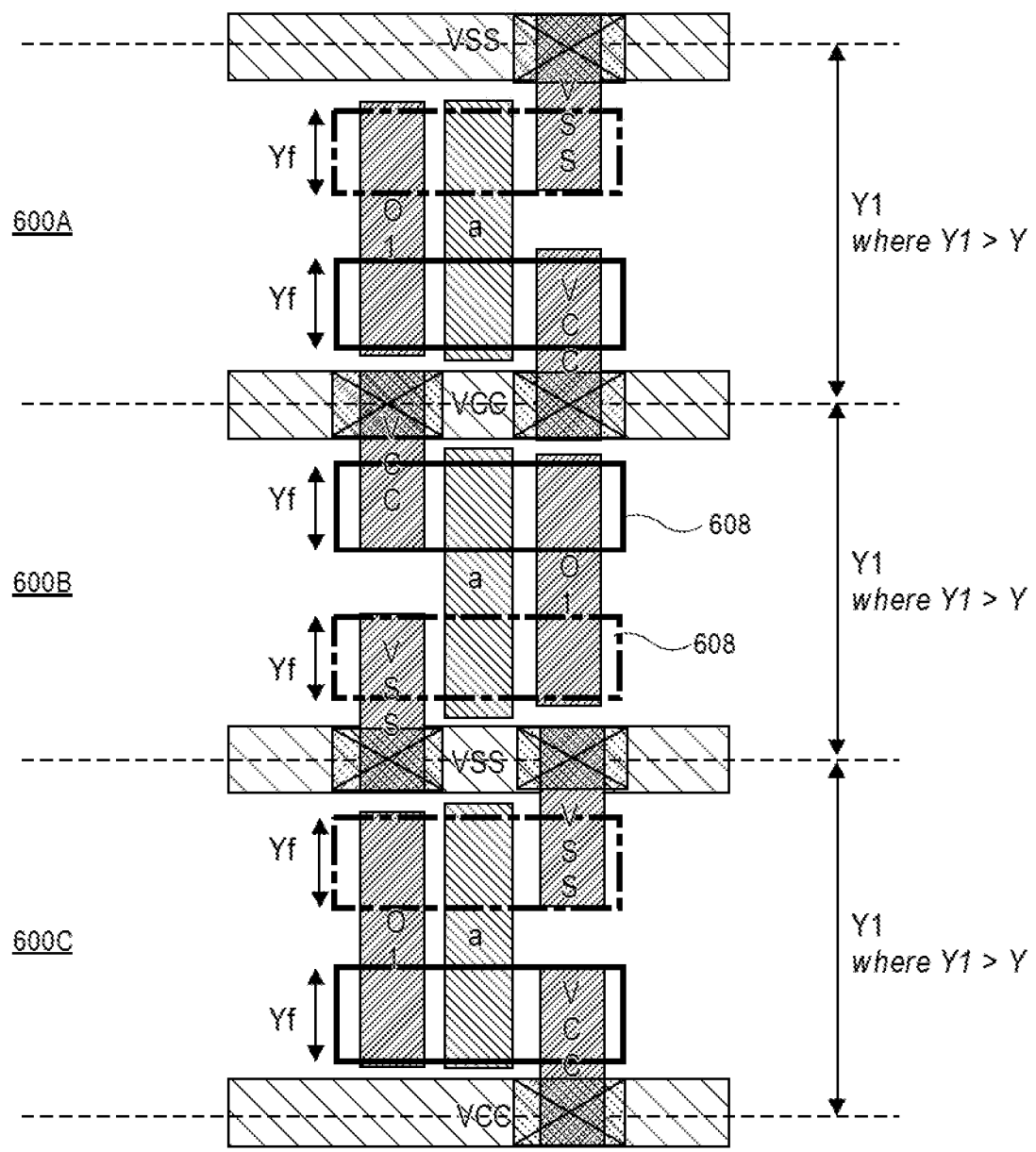
FIG. 6 illustrates an example layout of a column of SPCA1 cells having devices of size Yf.

FIG. 6 illustrates an example layout of a column of SPCA1 cells 600A-600C having devices 608 of size Yf. FIG. 3 showed that when device sizes of Yf are used with SPCA cells 101 having a cell height Y, shorts are created. But when devices 608 of size Yf are used in the SPCA1 cells 600A-600C having a cell height Y1, where Y1>Y, the increased cell height in SPCA1 provides more space so that power TCNs and signal TCNs in adjacent cells do not abut, thus avoiding shorts between them. Also, in this solution, SPCA1 cells 600A-600C are able to use larger devices of size Yf (when compared to the maximum device size of Yf1 in SPCA shown in FIG. 4), which also solves the reduced drive problem.

Figure 7:
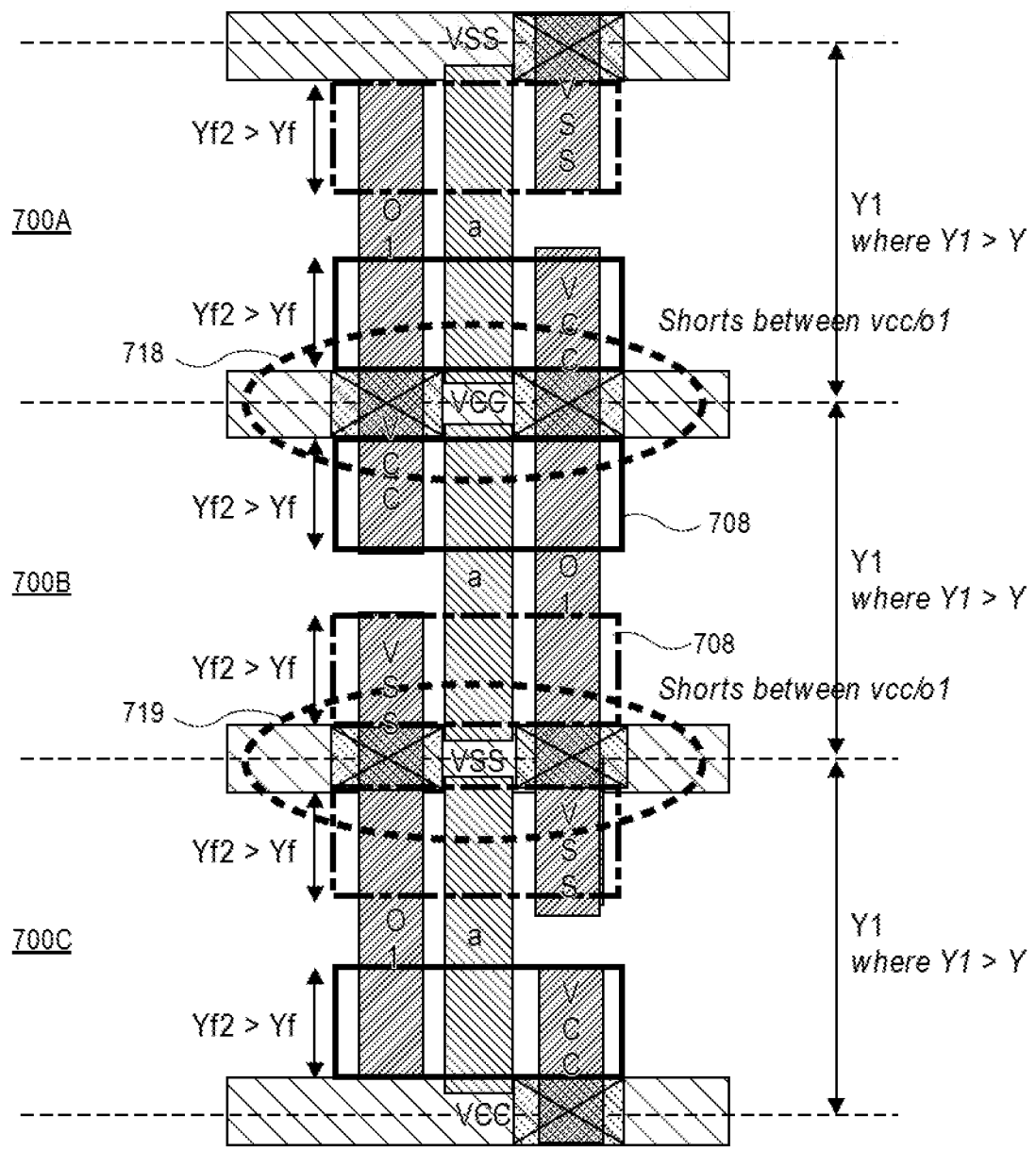
FIG. 7 illustrates an example layout of a column of SPCA1 cells having devices of size Yf2.

FIG. 7 illustrates an example layout of a column of SPCA1 cells 700A-700C having devices 708 of size Yf2, where Yf2>Yf. The larger SPCA1 cells 700A-700C help to pack larger devices 708 than those possible in SPCA. However, SPCA1 still cannot pack a maximum device size of Yf2, where Yf2>Yf, which is possible because of the taller cell height, as the maximum device size of Yf2 will create shorts, as shown by dashed circles 718 and 719, the same way devices 108 of size Yf create shorts in SPCA, as shown in FIG. 3. Also, area of the cell increases in SPCA1 without getting full benefit for cell performance, therefore the full potential of the cell is not completely realized.

Figure 8:
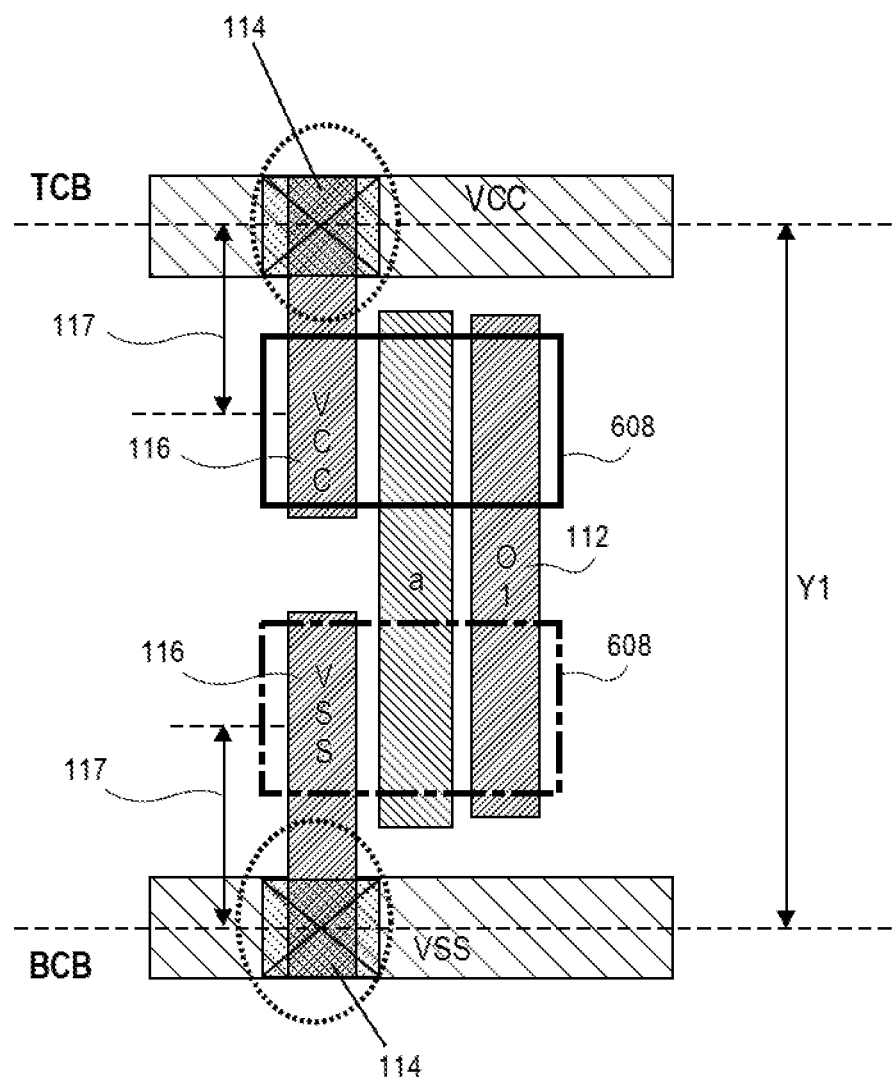
FIG. 8 further illustrates the use of smaller devices of size Yf shown in FIG. 6 with SPCA1.

FIG. 8 further illustrates the use of smaller devices 608 of size Yf shown in FIG. 6 with SPCA1. Even when used with devices 608 of size Yf, solution 1 still fails to solve the cell performance loss problem since the power VCTs 114 do not land directly over the devices 608 and current must travel an extra distance 117 to each device 608 from the power VCTs 114 on the top/bottom cell boundary and through the power TCNs 116.

Solution 2

Figure 9:
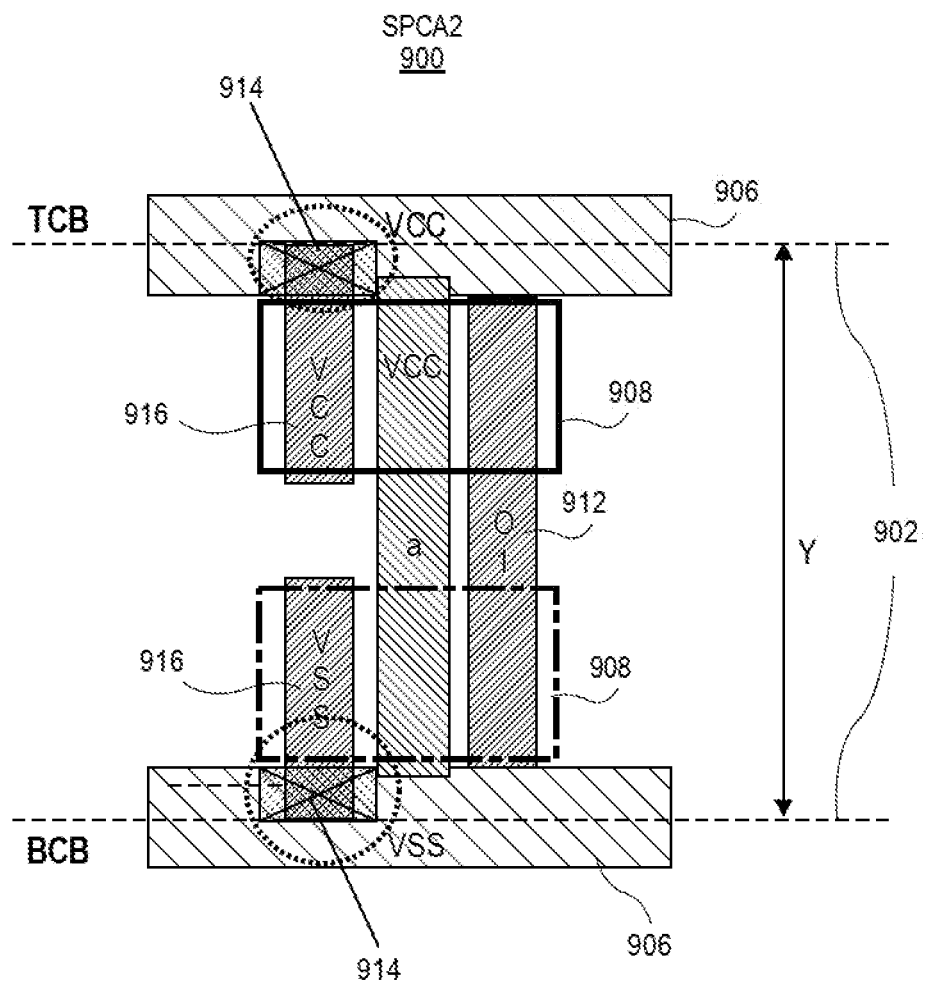
FIG. 9 illustrates an example inverter layout in an SPCA2 cell having narrow power VCTs (compared to SPCA1).

Solution 2 defines an SPCA, referred to herein as SPCA2, having narrower power VCTs (compared to SPCA1) that are each aligned to only one half the height of a power track, as shown in FIG. 9.

FIG. 9 illustrates an example inverter layout in an SPCA2 cell 900 having narrow power VCTs 914 (compared to SPCA1). Shared power tracks 906 along the top/bottom of the cell boundary 902 are connected to devices 908 through power VCTs 914 and corresponding power TCNs 916. The SPCA2 cell 900 has a cell height of Y. In one embodiment, the power VCTs 914 are one-half the height of the shared power tracks 906 and are aligned to only one side (e.g., the top/bottom half) of power tracks 906, as shown.

Although an SPCA cell with devices of size Yf create a shorts problem, as shown in FIG. 3, when the same cell is implemented in SPCA2 with a power VCT aligned to only one side of power tracks, smaller power VCTs 914 can be used, which in turn reduces power TCN 916 extensions outside the top/bottom cell boundaries 902.

Figure 10:
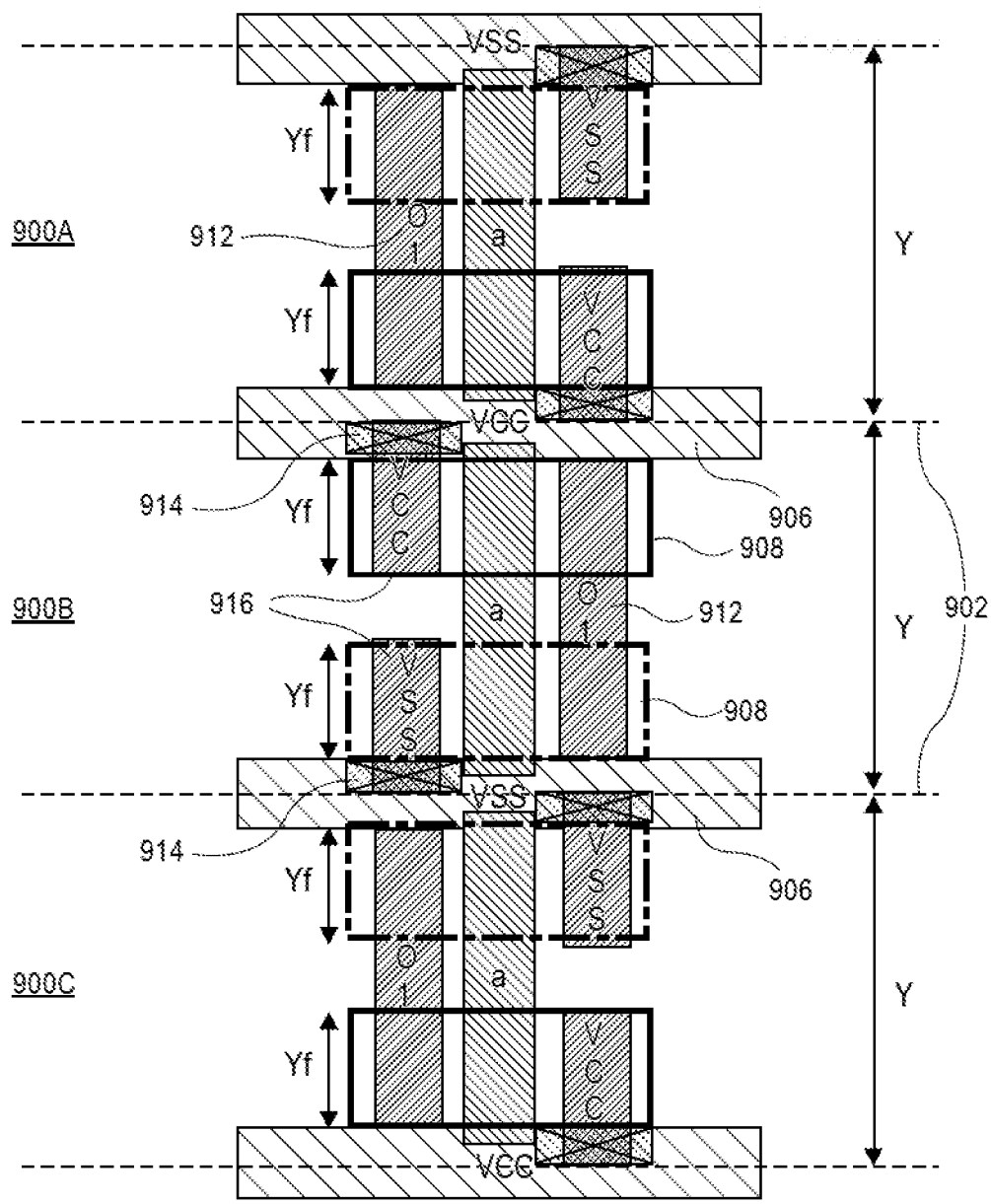
FIG. 10 illustrates an example layout of a column of SPCA2 cells having narrow power VCTs aligned to only one side of power tracks.

FIG. 10 illustrates an example layout of a column of SPCA2 cells 900A-900C having narrow power VCTs 914 aligned to only one side of power tracks 906. When SPCA2 cells 900A-900C are abutted, there is more gap between the power TCNs 916 and the signal TCNs 912, thus shorts are avoided, as shown. In solution 2, SPCA2 cells 900A-900C are able to use the larger device of size Yf (compared to the maximum device size Yf1 possible in SPCA), which also solves the reduced drive encountered in SPCA. In this way, SPCA2 solves both the shorts and the reduce drive problems without increasing the cell height.

Figure 11:
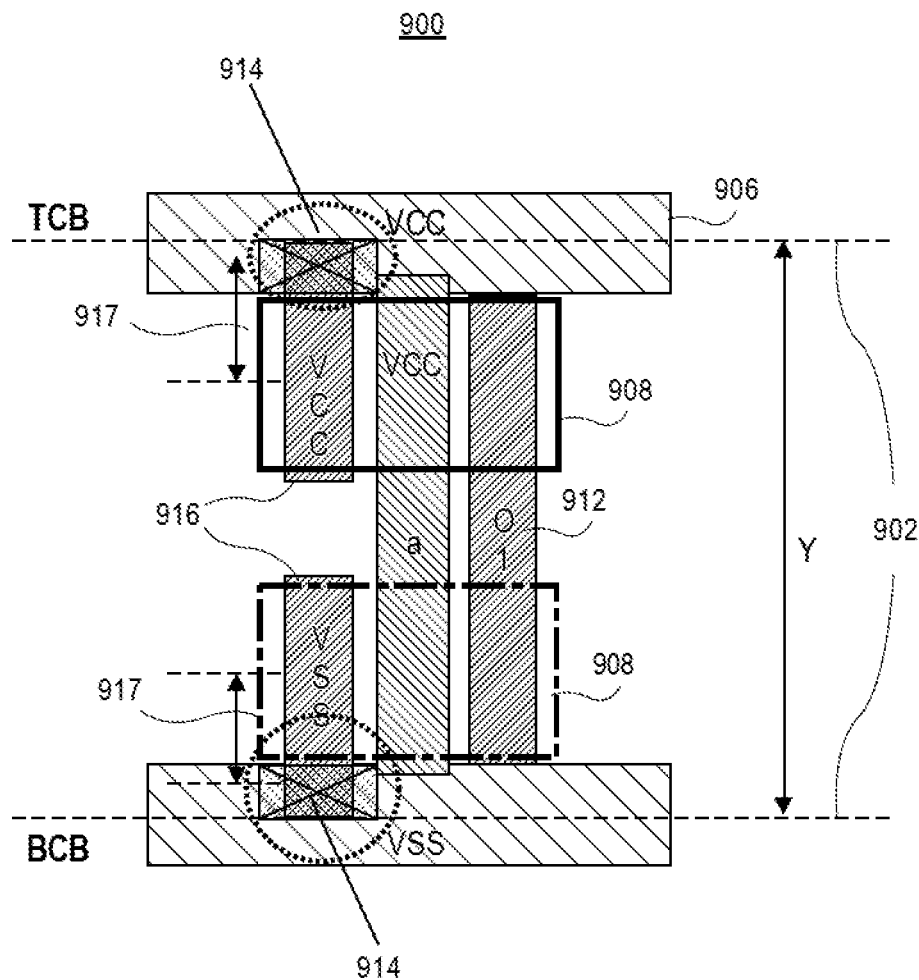
FIG. 11 further illustrates the use of SPCA2 with narrow power VCTs specified in solution 2.

FIG. 11 further illustrates the use of SPCA2 with narrow power VCTs 914 specified in solution 2. Despite the benefits of solution 2 above, solution 2 still fails to solve the cell performance loss problem. This is because the power VCTs 914 do not land directly over the devices 908 and current must travel an extra distance 917 to each device 908 from the power VCTs 914 on the top/bottom cell boundaries 902 and through the power TCNs 916, as shown in FIG. 11. Also, power VCTs 914 aligned only to one side of the wide power tracks 906 introduces manufacturability complexities when repeated on edges of the power tracks 906 after cells 900 are abutted.

Solution 3

Figure 12:
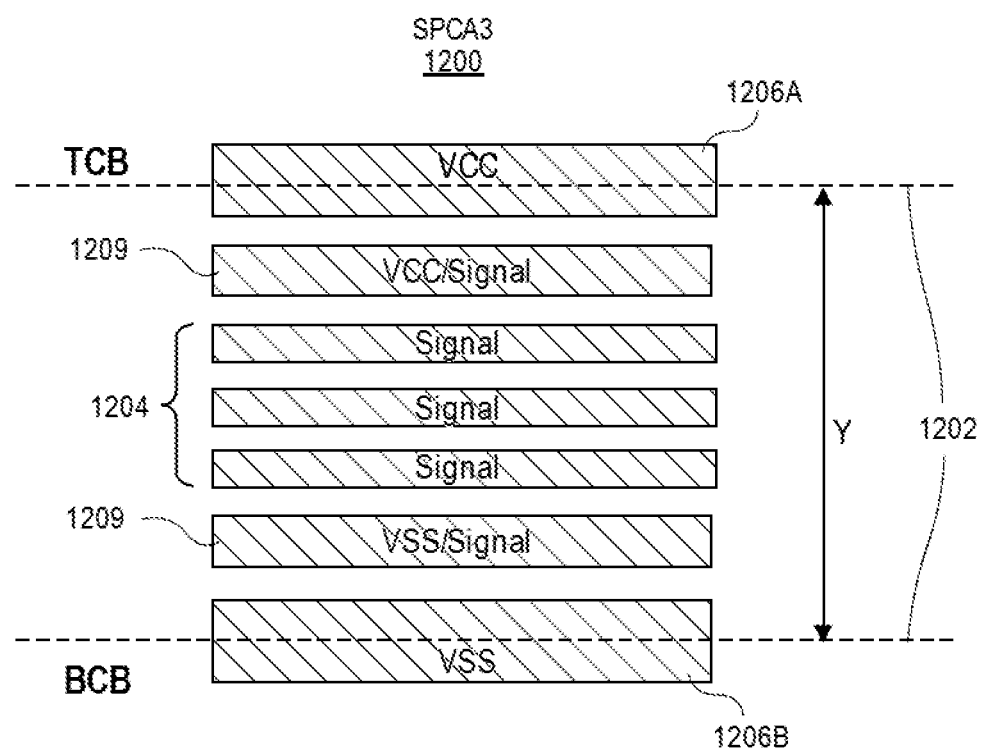
FIG. 12 illustrates an SPCA3 cell layout having additional inside power tracks that may be used for power (Vcc/Vss).

Solution 3 defines an SPCA, referred to herein as SPCA3, having boundary power tracks as in SPCA, but with additional combination power/signal tracks that may be used for power nets or signal routing, as shown in FIG. 12.

FIG. 12 illustrates an SPCA3 cell layout and additional inside power/signal tracks that may be used for power (Vcc/Vss) or signals. An SPCA3 cell 1200 is defined by a cell boundary 1202. On the M0 level, the SPCA3 cell 1200 includes a plurality of substantially parallel interconnect lines 1204 or signal tracks, and a set of power tracks 1206A and 1206B (collectively referred to as power tracks 1206) along the top cell boundary (TCB) and bottom cell boundary (BCB) 1202 for Vcc and Vss, respectively. The distance between the TCB and BCB defines a cell height Y for the cell 1200. The SPCA3 cell 1200 has boundary power tracks as in SPCA, and further includes at least one or more inside power/signal tracks 1209 that may be used either for power nets or for signal routing inside the cell as necessitated due to cell design tradeoffs. As the additional inside power/signal tracks 1209 may be used for either power or signal routing, the inside power/signal tracks 1209 are not dedicated to power like the boundary power tracks 1206.

Figure 13:
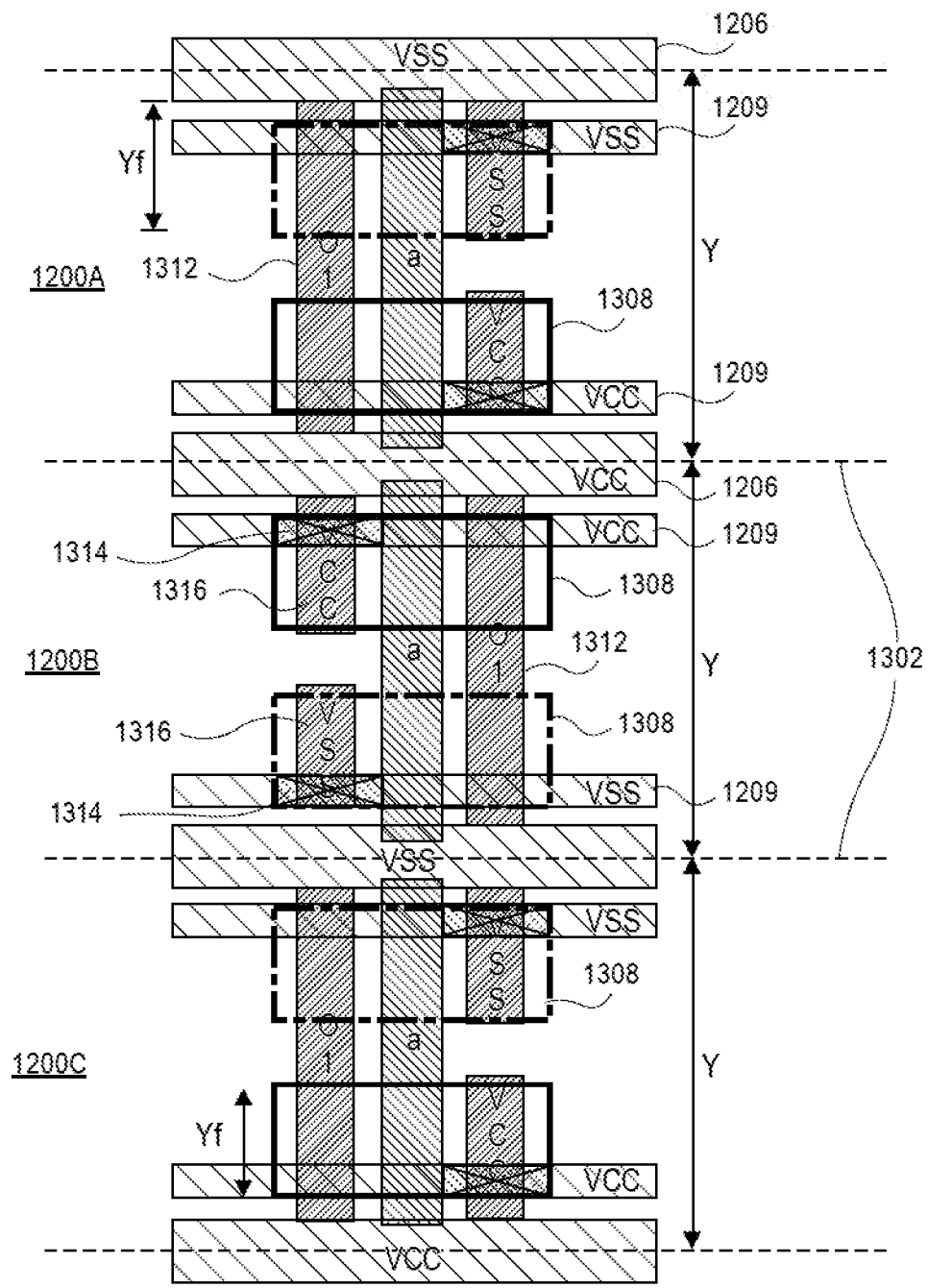
FIG. 13 illustrates an example layout of a column of SPCA3 cells having boundary power tracks and at least one additional inside power track that may be used for either power or signals.

FIG. 13 illustrates an example layout of a column of SPCA3 cells 1200A-1200C (collectively cells 1200) having boundary power tracks 1206 and at least one additional inside power/signal track 1209 that may be used for either power or signals. In SPCA3, the maximum device size is Yf, which is the same as in SPCA. However, SPCA with device size Yf creates a shorts problem, as shown in FIG. 3. But when the same cell is included in SPCA3, power VCTs 1314 are placed on the additional power/signal tracks 1209 inside the cell, which keeps the power VCTs 1314 completely inside the cell 1200. Consequently, when two cells 1200 are abutted there is more of a gap between signal TCNs 1312 of one cell and the power TCNs 1316 of a top/bottom abutting cell. The result of SPCA3 is clean cell abutment that avoids shorts. In solution 3, the SPCA3 cell 1200 is able to use a larger device with size=Yf (when compared to maximum device size possible in SPCA), which solves the reduced drive problem encountered with SPCA.

Figure 14:
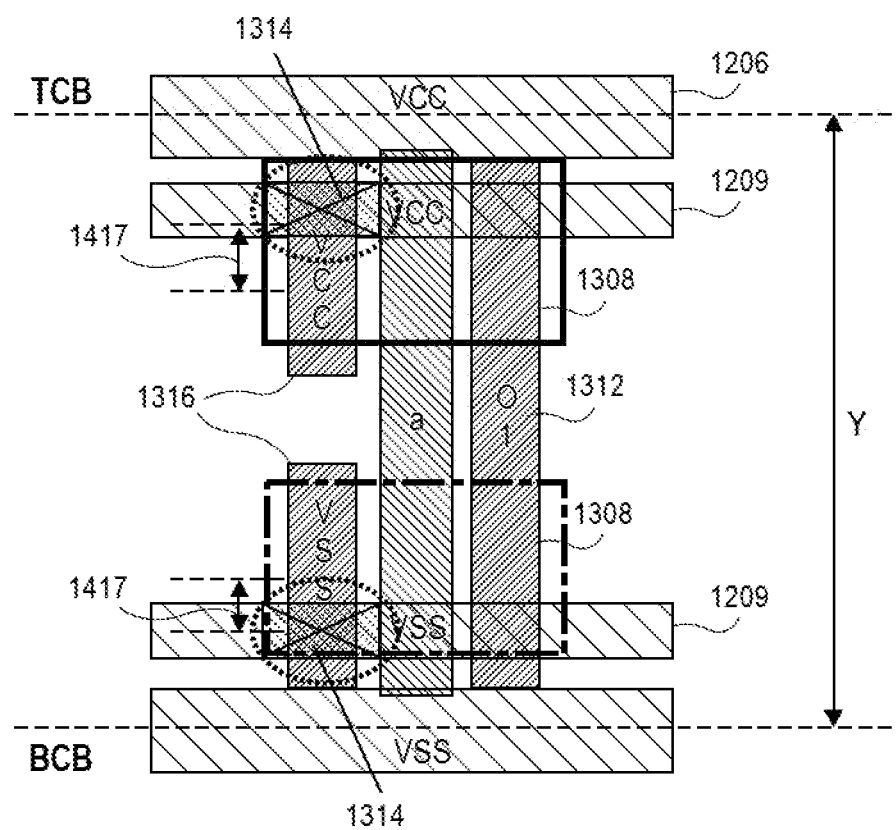
FIG. 14 further illustrates the use of SPCA3 having boundary power tracks and at least one additional inside power track.

FIG. 14 further illustrates the use of SPCA3 having boundary power tracks 1206 and a set of additional inside power/signal tracks 1209. SPCA3 with cell height Y and devices 1308 of size Yf reduces performance loss due to the power VCTs 1314 landing directly on the devices 1308. This significantly reduces the distance 1417 between the power VCTs 1314 and centers of the devices 1308 through the power TCNs 1316, as shown in FIG. 14.

If the additional power/signal tracks 1209 inside the SPCA3 cell 1200 is dedicated to power, then SPCA3 solves the three problems associated with SPCA. Solution 3 has disadvantages however. One problem is that SPCA3 reduces number of available interconnect lines 1204 signal tracks for intra-cell routing and can increase the size of certain types logic cells in an X direction, as shown in FIGS. 15 and 16.

Figure 15:
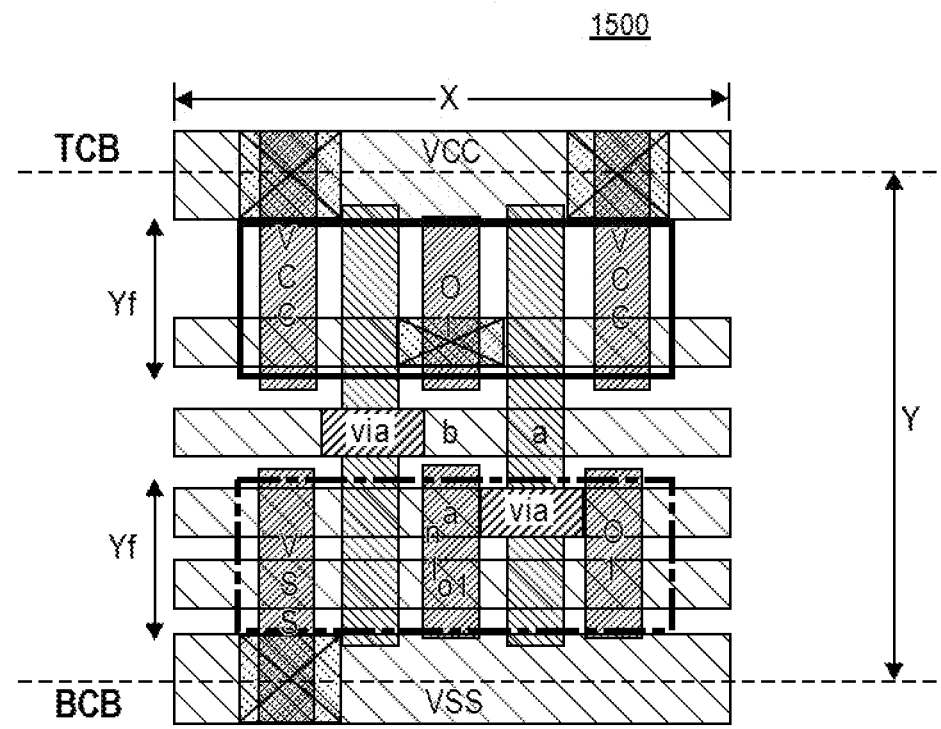
FIG. 15 illustrates a NAND2 layout in SPCA.
Figure 16:
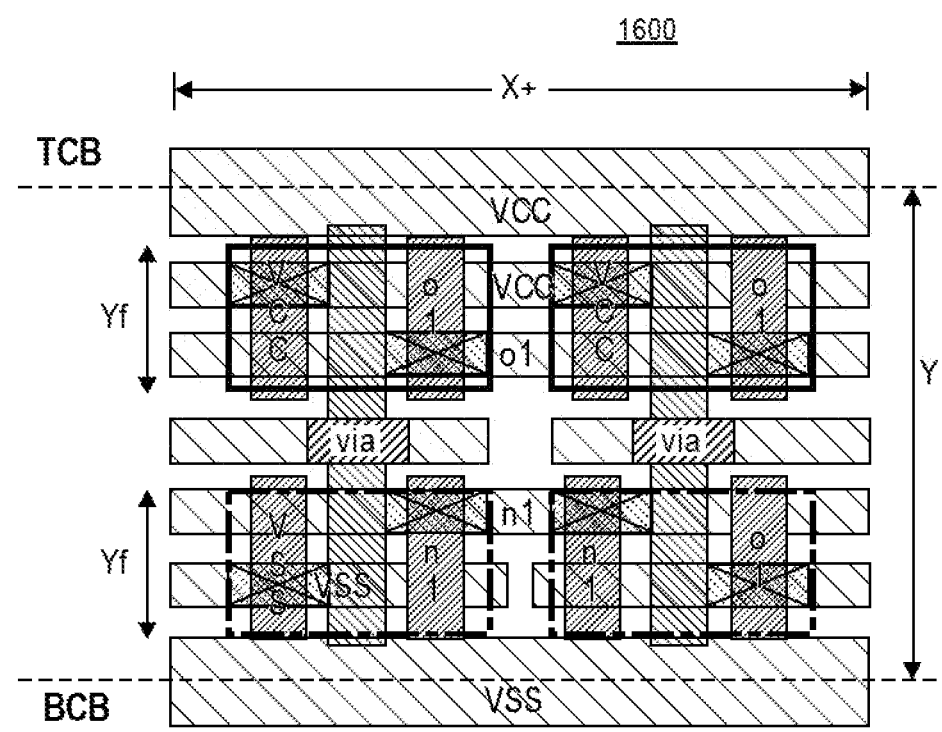
FIG. 16 illustrates the same NAND2 layout in SPCA3 with both Vcc and Vss coupled to power tracks inside the cell.

FIG. 15 illustrates a NAND2 layout 1500 in SPCA, while FIG. 16 illustrates the same NAND2 layout 1600 in SPCA3, where additional power/signal tracks 1209 inside the cell are used for both Vcc and Vss. From a visual comparison, it can be seen that the NAND2 layout 1600 in SPCA3 in FIG. 16 increases in size in the X direction.

Figure 17:
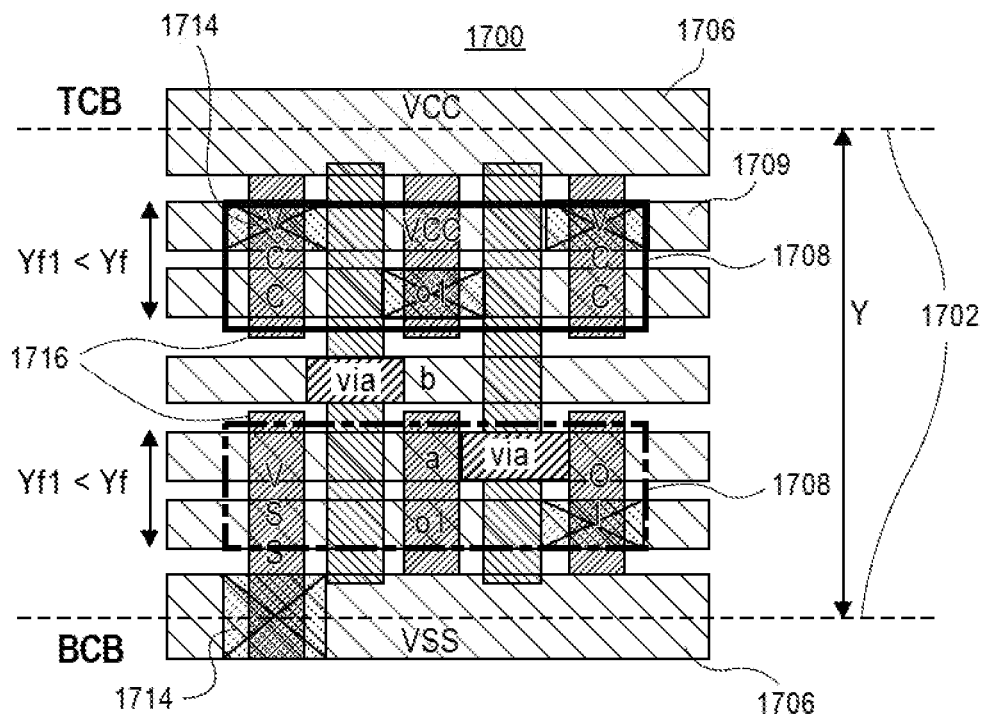
FIG. 17 illustrates a NAND2 layout in SPCA3 with power tracks on the cell boundary and a single power track within the cell boundary.

In applications where increasing the area of the cells is not a viable choice, then one embodiment makes use of the additional power/signal tracks inside the cells opportunistically, where a power track along the cell boundary is used for Vss and another power/signal track within the cell boundary is used for Vcc, as shown in FIG. 17.

FIG. 17 illustrates a NAND2 layout 1700 in SPCA3 with power tracks 1706 on the cell boundary 1702 and a power/signal track 1709 within the cell boundary 1702. In one example, the power track 1706 on the cell boundary is for Vss and the power/signal track 1709 within the cell boundary is for Vcc, where the power tracks 1706 and 1709 are coupled to power TCNs 1716 through power VCTs 1714, respectively. The embodiment shown, however, requires that the sizes of the devices 1708 have to be reduced to avoid shorts, such as shown in FIG. 4. For example, the devices 1708 may require a size of Yf1, rather than size Yf, where Yf1<Yf. The problem is that reducing device sizes reduces drive of the cell 1700 and reintroduces the problem of reduced drive. Consequently, drive has to be sacrificed in this architecture to save cell area in this embodiment. Also, as number of signals that need to be routed inside the cell increases (like in logic cells NAND3, AOI, etc.), both the additional power/signal tracks 1209 inside the cell will have to be used for signal routing to save area. Then only power tracks 1706 along the cell boundary are available for Vcc and Vss, which then essentially converts SPCA3 to SPCA.

According to the disclosed embodiments, a standard cell architecture is proposed in which power tracks dedicated to Vcc and Vss are located completely inside the cell without any power tracks along the cell boundary on the same metal level. Consequently, the power TCNs and power VCTs are also located completely inside the cell. Accordingly, the standard cell architecture of the disclosed embodiments is referred to herein as Inside Power Cell Architecture (IPCA). As described below, IPCA solves all three of the above-identified problems without complicating manufacturing needs and/or increasing manufacturing costs.

Figure 18:
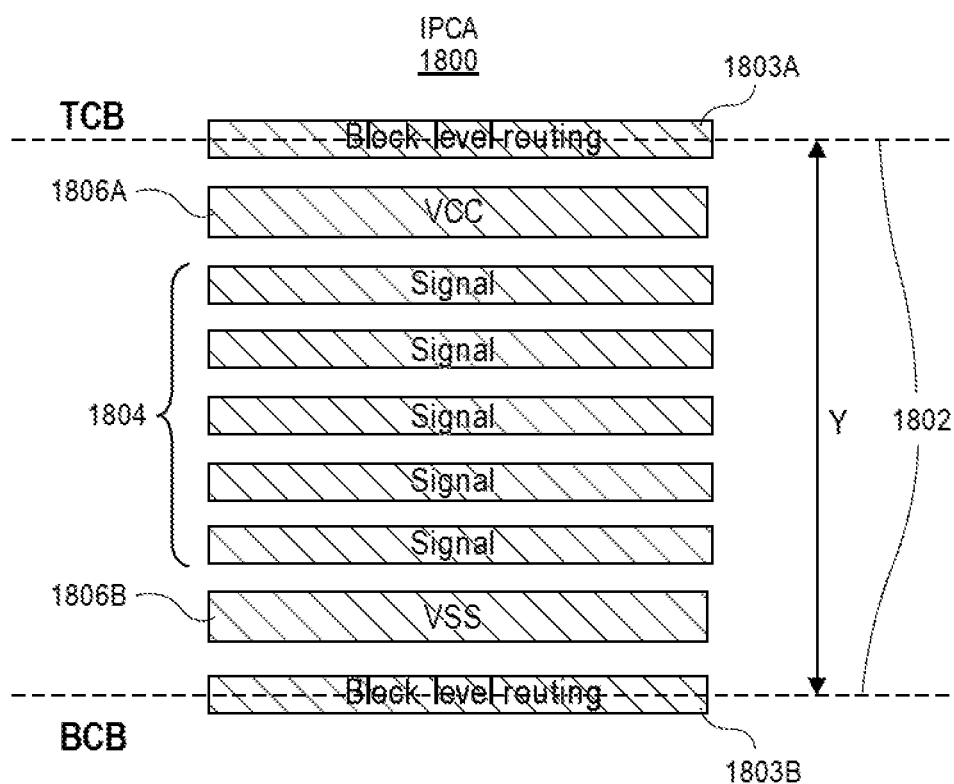
FIG. 18 illustrates an inside power cell architecture (IPCA) with power tracks for both Vcc and Vss located completely inside the cell without any power tracks along the cell boundary.

FIG. 18 illustrates an IPCA cell layout with power tracks for both Vcc and Vss located completely inside the cell without any power tracks along the cell boundary on the same metal level. An IPCA cell 1800 on a metal level, e.g., M0, is defined by a cell boundary 1802 having a cell height of Y. On the M0 level, the IPCA cell 1800 includes a plurality of substantially parallel interconnect lines 1804 or signal tracks inside the cell boundary 1802. According to the disclosed embodiments, instead of power tracks along the top cell boundary (TCB) and bottom cell boundary (BCB), the IPCA cell 1800 includes power tracks 1806A and 1806B that are dedicated to power (Vcc and Vss) and are located completely inside the cell boundary 1802 without any power tracks along the cell boundary 1802 on the metal level (e.g., M0). In one embodiment, the interconnect lines 1804 are located between the power tracks 1806A and 1806B (collectively referred to as power tracks 1806). In a further embodiment, the IPCA cell 1800 includes block-level routing interconnects 1803A and 1803B along opposite sides of the cell boundary (i.e., TCB and BCB), respectively.

Figure 19:
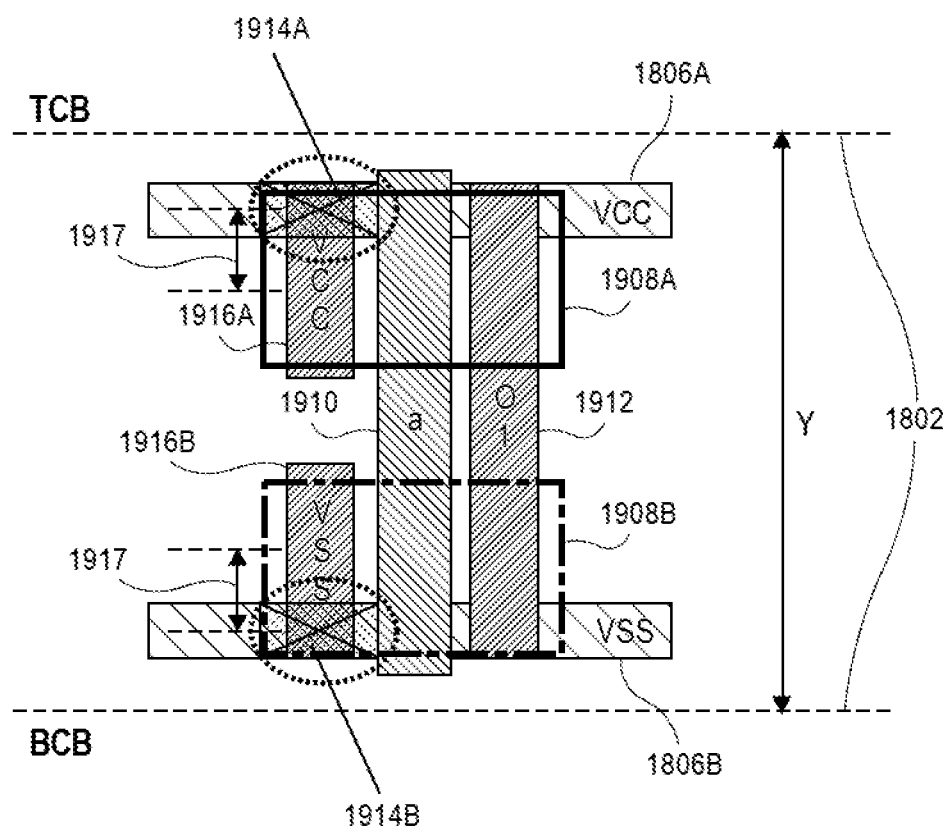
FIG. 19 illustrates an example inverter layout in an IPCA cell showing components in a device level and the M0 level for IPCA cell.

FIG. 19 illustrates an example inverter layout in an IPCA cell 1801 showing components in a device level and the M0 level for IPCA cell 1801. In one embodiment, the M0 level for IPCA cell 1801 includes Vcc power track 1806A adjacent to the TCB and Vss power track 1806B adjacent to the BCB. The IPCA cell 1801 is shown further including two devices 1908A and 1908B inside the cell boundary 1802 on the device level below the M0 level. On the device level, a poly gate 1910, and a signal trench contact (TCN) 1912 are shown extending across the two devices 1908 in a direction generally orthogonal to the direction of the power tracks 1806.

Power trench contact (TCN) 1916A is coupled to device 1908A on the device level, and power TCN 1916B is coupled to device 1908B on the device level within the cell boundary 1802. The power TCNs 1916A and 1916B (collectively referred to as power TCNs 1916) may be formed following a deposition of dielectric layer or material having a dielectric constant lower than a dielectric constant of $SiO_2$ (e.g., a low k dielectric material) on the device layer (e.g., over or on devices such as transistors) and following a patterning of openings through dielectric layer to the devices. The power TCNs 1916 may be formed by a chemical or physical deposition process. In the case of a copper material for the trench contacts, such contacts may be formed by forming openings through dielectric layer to expose a desire region of the devices followed by an electrodeposition process wherein an optional barrier layer is formed in the openings of dielectric layer followed by a seeding of the openings and depositing copper material, in the openings. A material for power TCNs 1916 of tungsten may be deposited by a physical deposition process.

Power via contacts (VCTs) 1914A and 1914B on a via level between the metal level and the device level couple the power tracks 1806A and 1806B to the devices 1908A and 1908B through the power TCNs 1916A and 1916B, respectively. More specifically, power VCT 1914A is coupled between power tracks 1806A and the power TCN 1916A, and power VCT 1914B is coupled between power track 1806B and power TCN 1916B.

In IPCA of the disclosed embodiments, power VCTs 1914 land directly over the devices 1908 because power tracks 1806 are completely inside the cell boundary 1802, significantly reducing the distance 1917 between centers of the power VCTs 1914 and centers of the devices 1908, as shown in FIG. 19.

Figure 20:
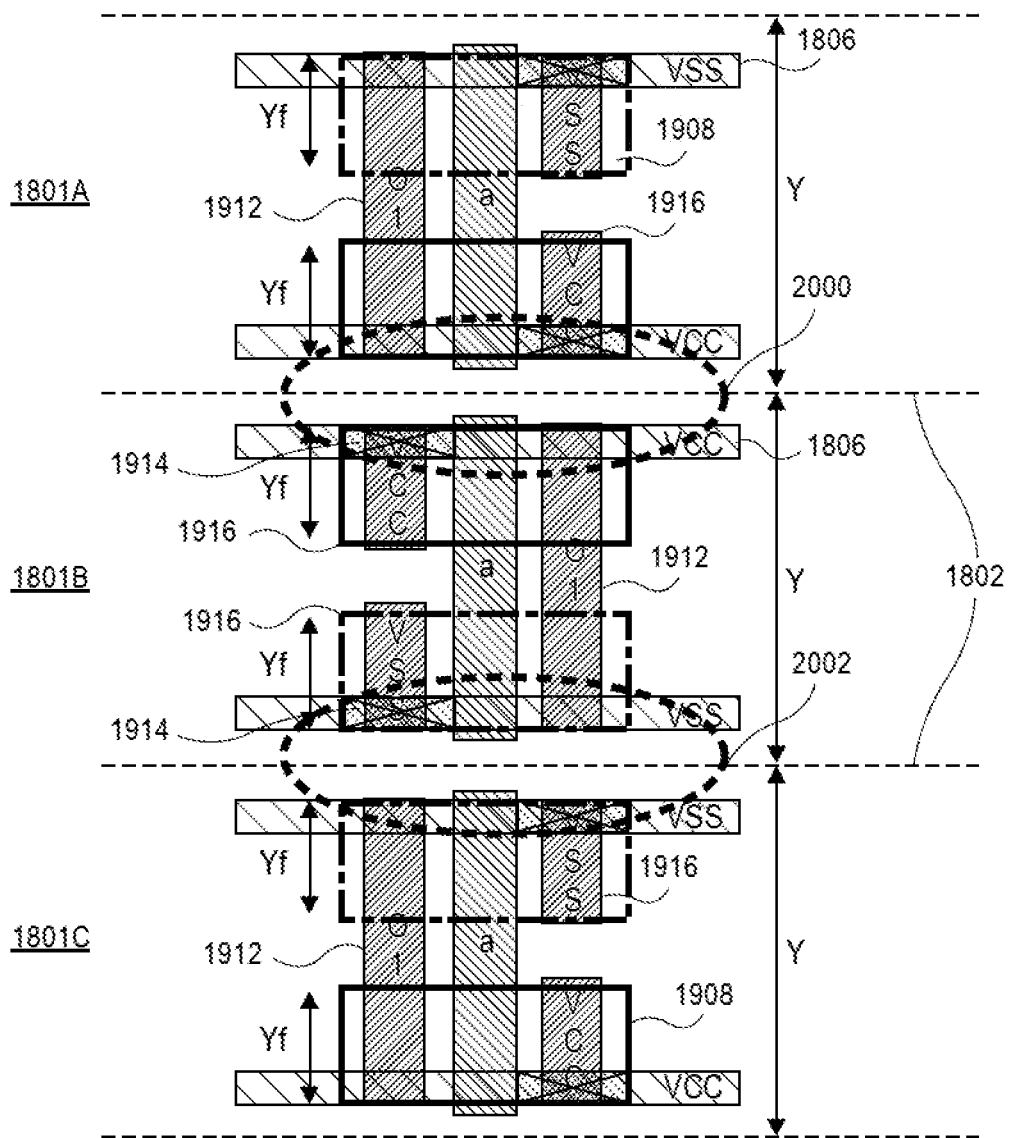
FIG. 20 illustrates an example layout of a column of IPCA cells having maximum device size of Yf and power track and power TCNs connections adjacent to top/bottom of the cell boundary in the column.

In integrated circuit designs, cells are arranged in a grid in which devices, such as transistors, are arranged in rows and columns, as shown in FIG. 20.

FIG. 20 illustrates an example layout of a column of IPCA cells 1801A-1801C having maximum device size of Yf and power track and power TCNs connections adjacent to top/bottom of the cell boundary 1802 in the column. The layout of two adjacent IPCA cells 1801 are inverted about their x- and y-axis and share top/bottom cell boundary 1802. In IPCA, if the maximum device size of the devices packed in a cell is Yf, and if such a cell is abutted with itself across top/bottom cell boundaries, then shorts do not exist between vertically adjacent power TCNs 1916 and signal TCNs 1912 due to the gap that exists between them, as shown by the area under the dashed circles 2000 and 2002. Dashed circle 2000 highlights the cell boundary between cell 1801A and cell 1801B and shows that no short exists between signal TCN 1912 in cell 1801A and Vcc power TCN 1916 in cell 1801B. Dashed circle 2002 highlights the cell boundary between cell 1801B and cell 1801C and shows that no short exists between Vss power TCN 1916 in cell 1801B and signal TCN 1912 in cell 1801B.

Also, when compared to SPCA1, the IPCA cell 1801 is able to use the same larger device of size Yf without the need to increase cell height. Accordingly, IPCA provides an improved solution to both the shorts problem and the reduced drive problem compared to SPCA1.

SPCA2 has narrower power VCTs (compared to SPCA1) that are each aligned to only one half of a power tracks, as shown in FIG. 9. As such, SPCA2 also solves both the shorts problem and the reduced drive problem without increase in cell height. But SPCA2 fails at solving the cell performance loss problem, as shown in FIG. 11. In IPCA, however, as power VCTs 1914 land directly over the devices 1908 (because power tracks 1806 are completely inside the cell), distance between the power VCTs 1914 and devices 1908 is significantly reduced. The IPCA also solves the cell performance loss problem, which makes IPCA a better alternative compared to SPCA2.

SPCA2 also has manufacturability issues due to the extensive use of power VCTs aligned to one side of the boundary power track. Manufacturing of such kind of power VCTs that are aligned to one side of power track cannot be controlled with precision, which leads to larger power VCT resistance variations, and in turn, larger overall cell performance variations. But IPCA always uses power VCTs 1914 aligned to both sides of interior power tracks 1806, which can be manufactured with more precision leading to lower via resistance and overall lower cell performance variation. In this way, IPCA is better than SPCA2 for manufacturability.

That leaves a comparison between SPCA3 and IPCA. SPCA3 has boundary power tracks as in SPCA, but with an additional inside power track that may be used for power nets or signal routing, as shown in FIG. 14. As such, SPCA3 also solves the shorts problem, cell performance loss and the reduced drive problem. Like IPCA, SPCA3 also, always aligns power VCTs to the entire width the power tracks, which also lack manufacturability issues. The major disadvantage of SPCA3, however, is loss of interconnect lines or signal tracks, which need to be removed to make space for the inside power track. SPCA3 typically uses a wider boundary track for power (even other Shared Power architectures such as SPCA, SPCA1 and SPCA2 also use a wider boundary track for power). Such wider boundary tracks will in lower resistance and can provide power effectively for two cells when cells are abutted. However, as wider boundary power tracks occupy more space in a cell height, space available for signal tracks is reduced. In addition to this, one more track inside the cell is used for power routing in SPCA3, which further reduces the number of tracks available for routing inside the cell, as shown in FIG. 16.

However, in IPCA, the boundary power tracks on the same level as the power tracks 1806 are not used in the cell design. Therefore, the width of the boundary tracks can be made as narrow as possible as it is not going to be used for routing power inside the cell. Also, the power tracks 1806 inside the cell in IPCA can also be made narrower than the width of the boundary power tracks in SPCA, SPCA1, SPCA2 and SPCA3, as the power tracks 1806 in IPCA only have to support one cell instead of two abutting cells. Reducing power track width will also not affect cell performance, as power needs to be supplied only to one cell. Both these features will provide more space for interconnects (signal tracks) 1804 and does not reduce number of interconnects (signal tracks) available for routing inside the cell.

Figure 21:
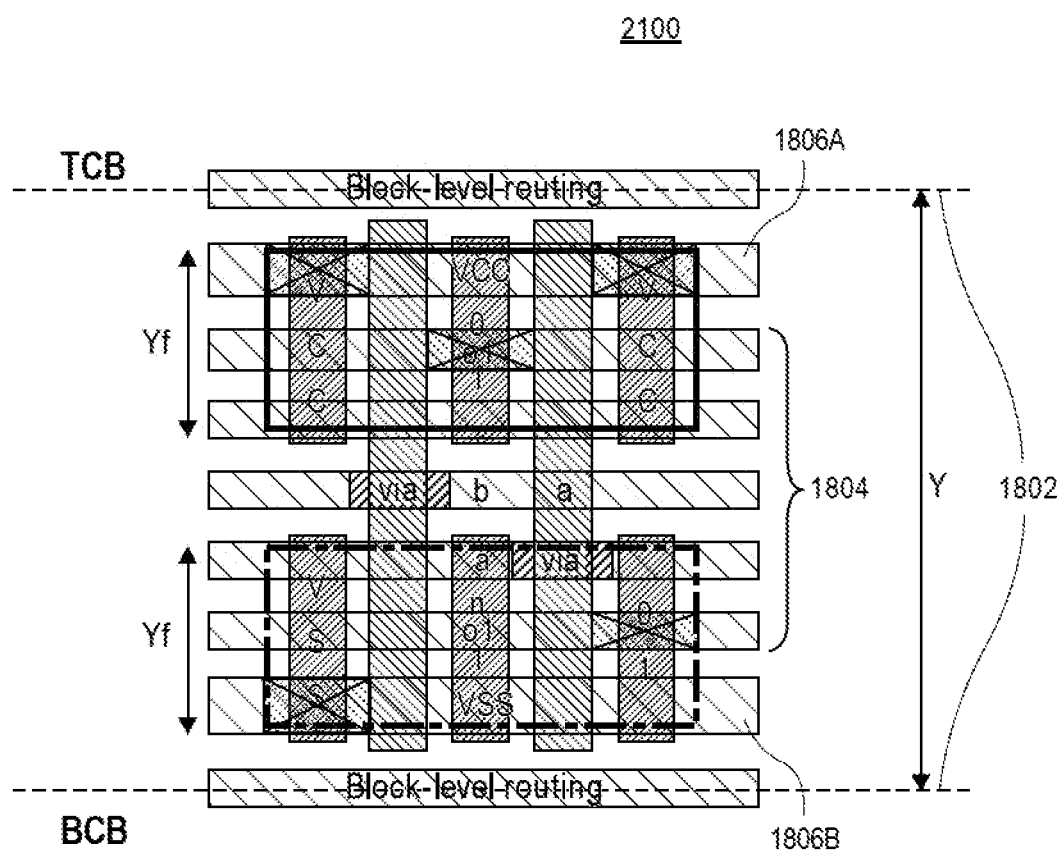
FIG. 21 illustrates an example NAND2 layout in IPCA in which power tracks are completely inside the cell boundary without any power tracks along the cell boundary.

FIG. 21 illustrates an example NAND2 layout in IPCA in which power tracks 1806A and 1806B are completely inside the cell boundary 1802 without any power tracks along the cell boundary 1802. The NAND2 layout 2100 in IPCA clearly illustrates that the number of interconnect lines 1804 are not reduced in IPCA and stays the same as in SPCA, SPCA1 and SPCA2. FIG. 21 also shows that NAND2 layout 2100 in IPCA is smaller in area (decrease in size in the X direction) when compared to the same NAND2 layout in SPCA3 shown in FIG. 16.

Accordingly, IPCA solves all the three SPCA problems of cell performance loss, shorts and reduced drive, without introducing cell area growth and other manufacturing complexities.

Generally, a method of fabricating an integrated circuit structure implementing IPCA comprises forming a cell on a metal level, the cell defined by a cell boundary. A plurality of substantially parallel interconnect lines are formed inside the cell boundary. A first power track and a second power track are formed dedicated to power and located completely inside the cell boundary without any power tracks along the cell boundary on the metal level.

More specifically, a method of fabricating a layout for an integrated circuit structure may comprise forming a first device and a second device inside the cell boundary on a device level. A first power trench contact (TCN) is formed on the first device inside the cell boundary. A second power TCN is formed on the second device inside the cell boundary. A first power via contact (VCT) is formed on the first power TCN directly over the first device inside the cell boundary. A second power via contact (VCT) is formed on the second power TCN directly over the second device inside the cell boundary. A cell is formed on a metal level above the device level, wherein the cell is defined by a cell boundary and comprises a plurality of substantially parallel interconnect lines inside the cell boundary, and a first power track and a second power track both dedicated to power and located completely inside the cell boundary on the metal level.

The integrated circuit structures described herein may be included in an electronic device. As an example of one such apparatus, FIGS. 22A and 22B are top views of a wafer and dies that include a standard cell architecture with power tracks completely inside a cell, in accordance with one or more of the embodiments disclosed herein.

Figure 22B:
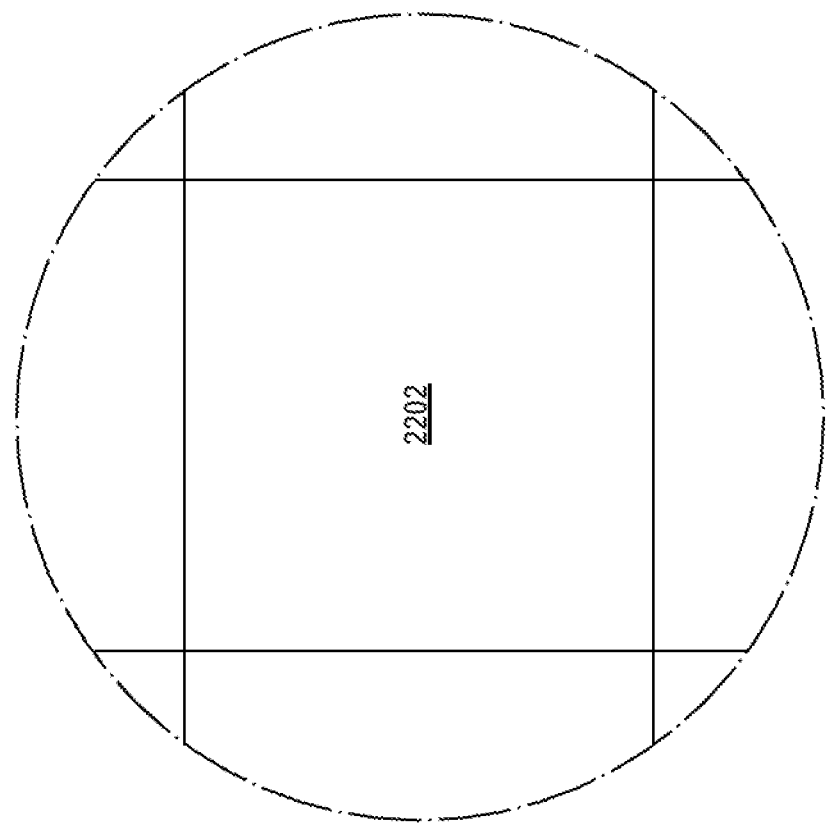
FIGS. 22A and 22B are top views of a wafer and dies that include a standard cell architecture with power tracks completely inside a cell, in accordance with one or more of the embodiments disclosed herein.
Figure 22A:
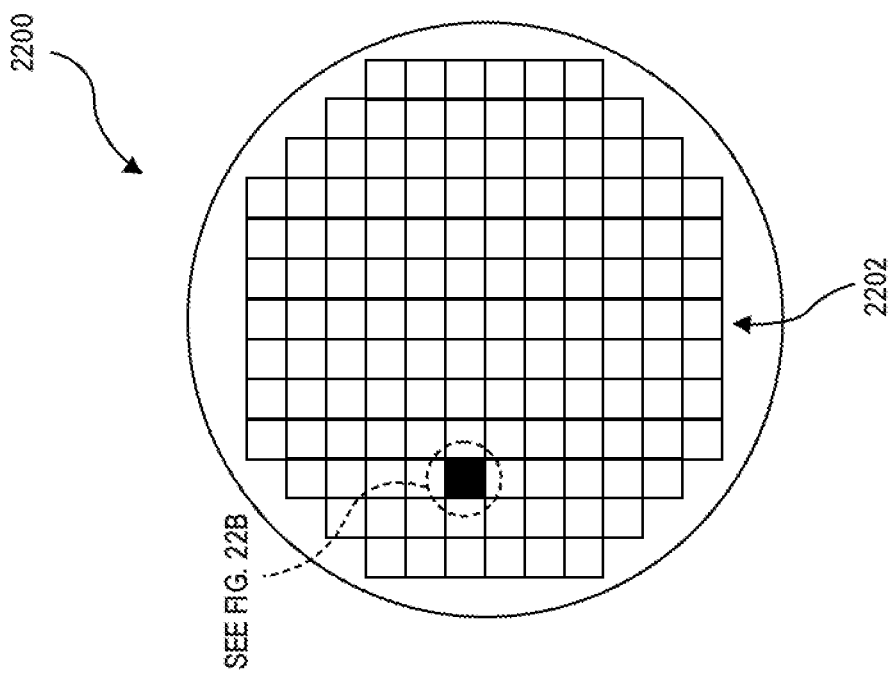

Referring to FIGS. 22A and 22B, a wafer 2200 may be composed of semiconductor material and may include one or more dies 2202 having integrated circuit (IC) structures formed on a surface of the wafer 2200. Each of the dies 2202 may be a repeating unit of a semiconductor product that includes any suitable IC (e.g., ICs including a standard cell architecture with power tracks completely inside a cell, such as described above. After the fabrication of the semiconductor product is complete, the wafer 2200 may undergo a singulation process in which each of the dies 2202 is separated from one another to provide discrete "chips" of the semiconductor product. In particular, structures that include embedded non-volatile memory structures having an independently scaled selector as disclosed herein may take the form of the wafer 2200 (e.g., not singulated) or the form of the die 2202 (e.g., singulated). The die 2202 may include one or more embedded non-volatile memory structures based independently scaled selectors and/or supporting circuitry to route electrical signals, as well as any other IC components. In some embodiments, the wafer 2200 or the die 2202 may include an additional memory device (e.g., a static random access memory (SRAM) device), a logic device (e.g., an AND, OR, NAND, or NOR gate), or any other suitable circuit element. Multiple ones of these devices may be combined on a single die 2202. For example, a memory array formed by multiple memory devices may be formed on a same die 2202 as a processing device or other logic that is configured to store information in the memory devices or execute instructions stored in the memory array.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 23:
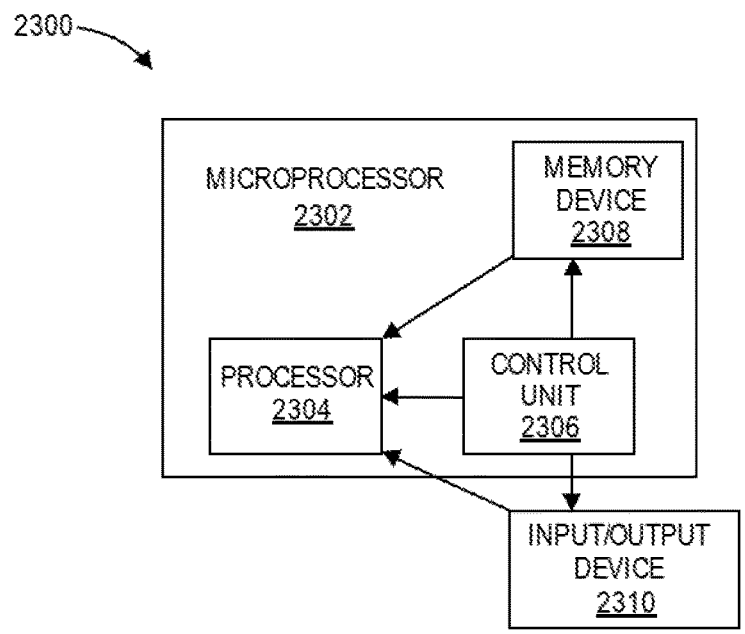
FIG. 23 illustrates a block diagram of an electronic system, in accordance with an embodiment of the present disclosure.

FIG. 23 illustrates a block diagram of an electronic system 2300, in accordance with an embodiment of the present disclosure. The electronic system 2300 can correspond to, for example, a portable system, a computer system, a process control system, or any other system that utilizes a processor and an associated memory. The electronic system 2300 may include a microprocessor 2302 (having a processor 2304 and control unit 2306), a memory device 2308, and an input/output device 2310 (it is to be appreciated that the electronic system 2300 may have a plurality of processors, control units, memory device units and/or input/output devices in various embodiments). In one embodiment, the electronic system 2300 has a set of instructions that define operations which are to be performed on data by the processor 2304, as well as, other transactions between the processor 2304, the memory device 2308, and the input/output device 2310. The control unit 2306 coordinates the operations of the processor 2304, the memory device 2308 and the input/output device 2310 by cycling through a set of operations that cause instructions to be retrieved from the memory device 2308 and executed. The memory device 2308 can include a non-volatile memory cell as described in the present description. In an embodiment, the memory device 2308 is embedded in the microprocessor 2302, as depicted in FIG. 23. In an embodiment, the processor 2304, or another component of electronic system 2300, includes a standard cell architecture with power tracks completely inside a cell, such as those described herein.

Figure 24:
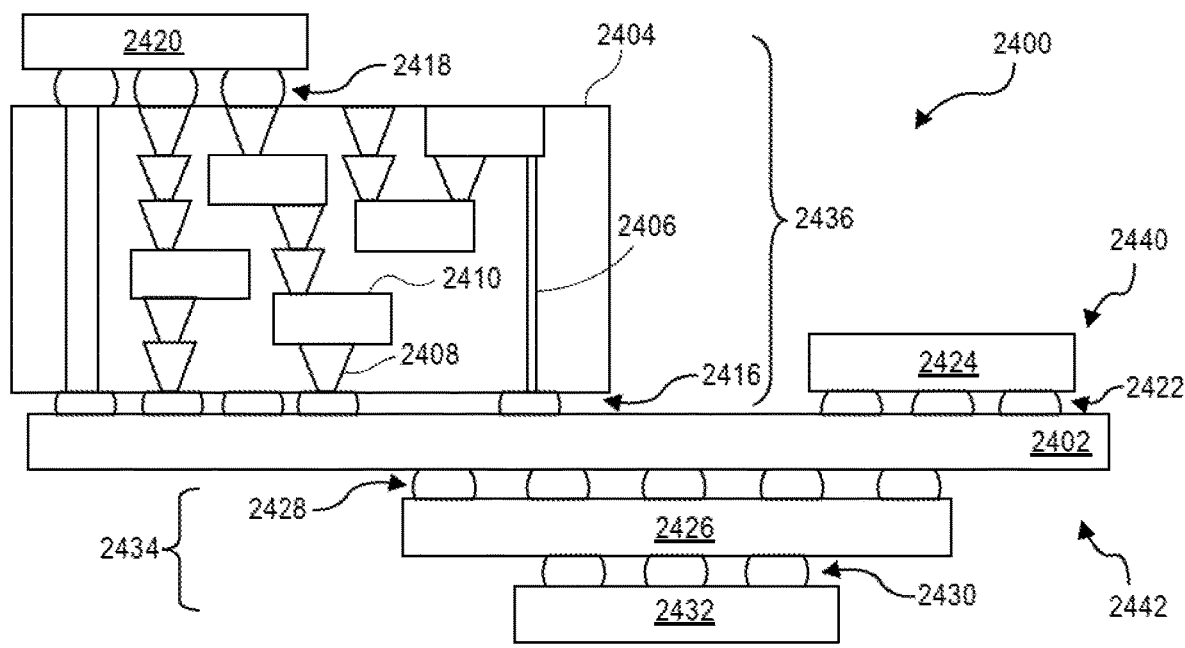
FIG. 24 is a cross-sectional side view of an integrated circuit (IC) device assembly that may include a standard cell architecture with power tracks completely inside a cell, in accordance with one or more of the embodiments disclosed herein.

FIG. 24 is a cross-sectional side view of an integrated circuit (IC) device assembly that may include a standard cell architecture with power tracks completely inside a cell, in accordance with one or more of the embodiments disclosed herein.

Referring to FIG. 24, an IC device assembly 2400 includes components having one or more integrated circuit structures described herein. The IC device assembly 2400 includes a number of components disposed on a circuit board 2402 (which may be, e.g., a motherboard). The IC device assembly 2400 includes components disposed on a first face 2440 of the circuit board 2402 and an opposing second face 2442 of the circuit board 2402. Generally, components may be disposed on one or both faces 2440 and 2442. In particular, any suitable ones of the components of the IC device assembly 2400 may include (a number of include) a standard cell architecture with power tracks completely inside a cell, such as disclosed herein.

In some embodiments, the circuit board 2402 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2402. In other embodiments, the circuit board 2402 may be a non-PCB substrate.

The IC device assembly 2400 illustrated in FIG. 24 includes a package-on-interposer structure 2436 coupled to the first face 2440 of the circuit board 2402 by coupling components 2416. The coupling components 2416 may electrically and mechanically couple the package-on-interposer structure 2436 to the circuit board 2402, and may include solder balls (as shown in FIG. 24), male and female portions of a socket, an adhesive, an underfill material, and/or any other suitable electrical and/or mechanical coupling structure.

The package-on-interposer structure 2436 may include an IC package 2420 coupled to an interposer 2404 by coupling components 2424. The coupling components 2424 may take any suitable form for the application, such as the forms discussed above with reference to the coupling components 2416. Although a single IC package 2420 is shown in FIG. 24, multiple IC packages may be coupled to the interposer 2404. It is to be appreciated that additional interposers may be coupled to the interposer 2404. The interposer 2404 may provide an intervening substrate used to bridge the circuit board 2402 and the IC package 2420. The IC package 2420 may be or include, for example, a die (the die 2202 of FIG. 22B), or any other suitable component. Generally, the interposer 2404 may spread a connection to a wider pitch or reroute a connection to a different connection. For example, the interposer 2404 may couple the IC package 2420 (e.g., a die) to a ball grid array (BGA) of the coupling components 2416 for coupling to the circuit board 2402. In the embodiment illustrated in FIG. 24, the IC package 2420 and the circuit board 2402 are attached to opposing sides of the interposer 2404. In other embodiments, the IC package 2420 and the circuit board 2402 may be attached to a same side of the interposer 2404. In some embodiments, three or more components may be interconnected by way of the interposer 2404.

The interposer 2404 may be formed of an epoxy resin, a fiberglass-reinforced epoxy resin, a ceramic material, or a polymer material such as polyimide. In some implementations, the interposer 2404 may be formed of alternate rigid or flexible materials that may include the same materials described above for use in a semiconductor substrate, such as silicon, germanium, and other group III-V and group IV materials. The interposer 2404 may include metal interconnects 2410 and vias 2408, including but not limited to through-silicon vias (TSVs) 2406. The interposer 2404 may further include embedded devices, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 2404. The package-on-interposer structure 2436 may take the form of any of the package-on-interposer structures known in the art.

The IC device assembly 2400 may include an IC package 2424 coupled to the first face 2440 of the circuit board 2402 by coupling components 2422. The coupling components 2422 may take the form of any of the embodiments discussed above with reference to the coupling components 2416, and the IC package 2424 may take the form of any of the embodiments discussed above with reference to the IC package 2420.

The IC device assembly 2400 illustrated in FIG. 24 includes a package-on-package structure 2434 coupled to the second face 2442 of the circuit board 2402 by coupling components 2428. The package-on-package structure 2434 may include an IC package 2426 and an IC package 2432 coupled together by coupling components 2430 such that the IC package 2426 is disposed between the circuit board 2402 and the IC package 2432. The coupling components 2428 and 2430 may take the form of any of the embodiments of the coupling components 2416 discussed above, and the IC packages 2426 and 2432 may take the form of any of the embodiments of the IC package 2420 discussed above. The package-on-package structure 2434 may be configured in accordance with any of the package-on-package structures known in the art.

Figure 25:
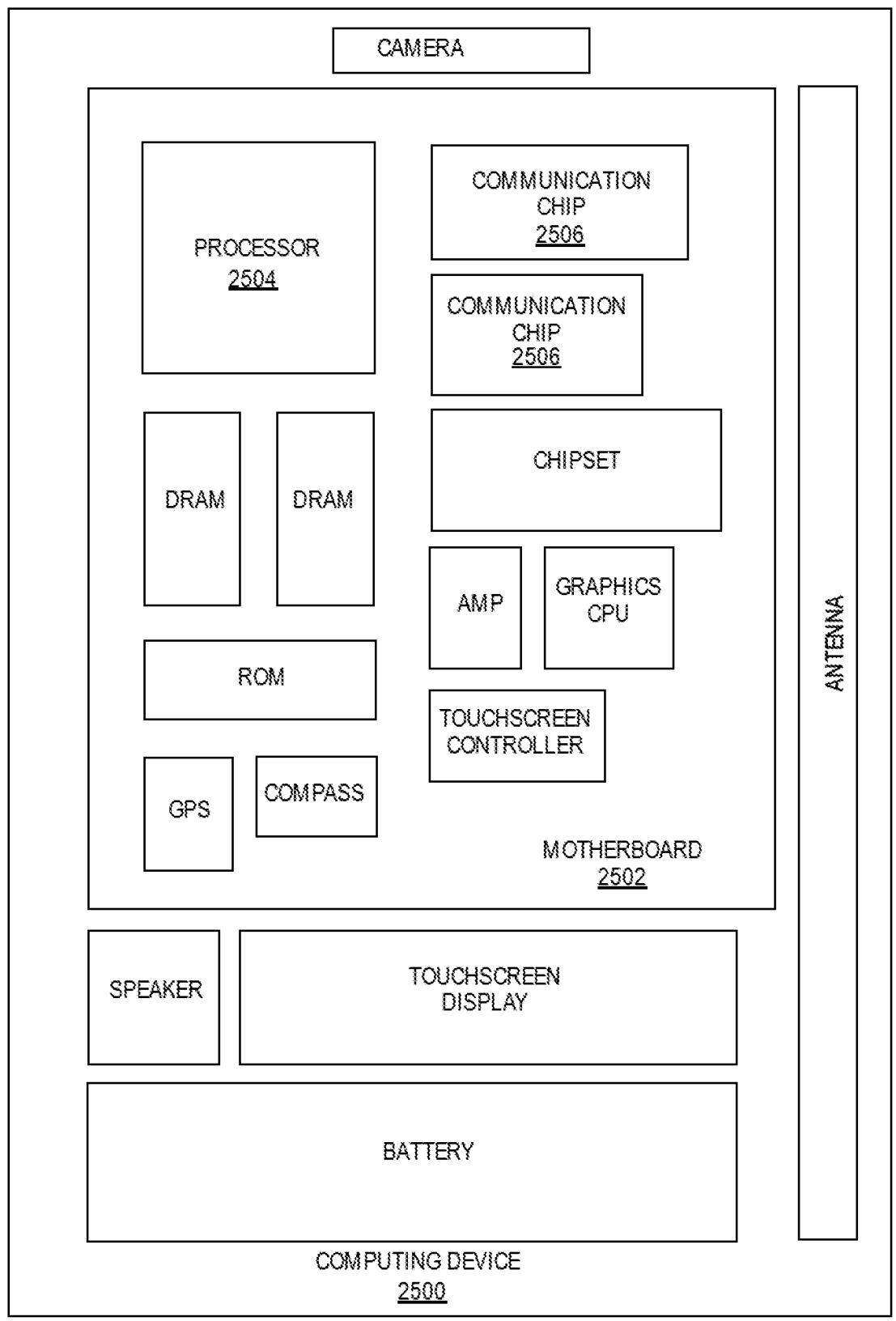

FIG. 25 illustrates a computing device 2500 in accordance with one implementation of the disclosure. The computing device 2500 houses a board 2502. The board 2502 may include a number of components, including but not limited to a processor 2504 and at least one communication chip 2506. The processor 2504 is physically and electrically coupled to the board 2502. In some implementations the at least one communication chip 2506 is also physically and electrically coupled to the board 2502. In further implementations, the communication chip 2506 is part of the processor 2504.

Depending on its applications, computing device 2500 may include other components that may or may not be physically and electrically coupled to the board 2502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 2506 enables wireless communications for the transfer of data to and from the computing device 2500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 2506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 2500 may include a plurality of communication chips 2506. For instance, a first communication chip 2506 may be dedicated to shorter range wireless communications such as Wi-Fi and Bluetooth and a second communication chip 2506 may be dedicated to longer range wireless communications such as GPS, EDGE, GPRS, CDMA, WiMAX, LTE, Ev-DO, and others.

The processor 2504 of the computing device 2500 includes an integrated circuit die packaged within the processor 2504. In some implementations of the disclosure, the integrated circuit die of the processor includes a standard cell architecture with power tracks completely inside a cell, in accordance with implementations of embodiments of the disclosure. The term "processor" may refer to any device or portion of a device that processes electronic data from registers and/or memory to transform that electronic data into other electronic data that may be stored in registers and/or memory.

The communication chip 2506 also includes an integrated circuit die packaged within the communication chip 2506. In accordance with another implementation of embodiments of the disclosure, the integrated circuit die of the communication chip includes a standard cell architecture with power tracks completely inside a cell, in accordance with implementations of embodiments of the disclosure.

In further implementations, another component housed within the computing device 2500 may contain an integrated circuit die that includes a standard cell architecture with power tracks completely inside a cell, in accordance with implementations of embodiments of the disclosure.

In various implementations, the computing device 2500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 2500 may be any other electronic device that processes data.

Thus, embodiments described herein include a standard cell architecture with power tracks completely inside a cell. The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example Embodiment 1

An integrated circuit structure includes a cell on a metal level, the cell defined by a cell boundary. A plurality of substantially parallel interconnect lines are inside the cell boundary. A first power track and a second power track are both dedicated to power and are located completely inside the cell boundary without any power tracks along the cell boundary on the metal level.

Example Embodiment 2

The integrated circuit structure of example embodiment 1, wherein the cell further includes block-level routing interconnects along opposite sides of the cell boundary on the metal level.

Example Embodiment 3

The integrated circuit structure of example embodiment 1 or 2, further comprising a device inside the cell boundary on a device level below the metal level. A power trench contact (TCN) is coupled to the device inside the cell boundary on the device level. A power via contact (VCT) is coupled between the power TCN and either the first power track or the second power track, wherein the power VCT is located inside the cell boundary on a via level between the metal level and the device level.

Example Embodiment 4

The integrated circuit structure of example embodiment 1, 2, or 3, wherein the first power track comprise a Vss power track and the second power track comprises a Vcc power track.

Example Embodiment 5

The integrated circuit structure of example embodiment 4, wherein the Vss power track is located adjacent to one of a top cell boundary (TCB) and a bottom cell boundary (BCB), and the Vcc power track is located adjacent to an opposite one of the cell boundaries.

Example Embodiment 6

The integrated circuit structure of example embodiment 5, wherein interconnect lines are located between the Vss power track and the Vcc power track.

Example Embodiment 7

The integrated circuit structure of example embodiment 1, 2, 3, 4, 5, or 6, wherein the power VCT lands directly over the device.

Example Embodiment 8

An integrated circuit structure comprises a cell on a metal level, the cell defined by a cell boundary. A plurality of substantially parallel interconnect lines are inside the cell boundary. A first power track and a second power track are both dedicated to power and are located completely inside the cell boundary on the metal level. A first device and a second device are inside the cell boundary on a device level below the metal level. A first power trench contact (TCN) is coupled to the first device inside the cell boundary on the device level. A second power TCN is coupled on a second inside the cell boundary on the device level. A first power via contact (VCT) is coupled between the first power TCN and the first power track, wherein the first power VCT is located inside the cell boundary and on a via level between the metal level and the device level. A second power via contact (VCT) is coupled between the second power TCN and the second power track, wherein the second power VCT is located inside the cell boundary and on a via level between the metal level and the device level.

Example Embodiment 9

The integrated circuit structure of example embodiment 8, wherein the cell further includes block-level routing interconnects along opposite sides of the cell boundary on the metal level.

Example Embodiment 10

The integrated circuit structure of example embodiment 8 or 9, wherein the first power track comprise a Vss power track and the second power track comprises a Vcc power track.

Example Embodiment 11

The integrated circuit structure of example embodiment 10, wherein the Vss power track is located adjacent to one of a top cell boundary (TCB) and a bottom cell boundary (BCB), and the Vcc power track is located adjacent to an opposite one of the cell boundaries.

Example Embodiment 12

The integrated circuit structure of example embodiment 11, wherein interconnect lines are located between the Vss power track and the Vcc power track.

Example Embodiment 13

The integrated circuit structure of example embodiment 8, 9, 10, 11, or 12, wherein the first power VCT lands directly over the first device, and the second power VCT lands directly over the second device.

Example Embodiment 14

The integrated circuit structure of example embodiment 8, 9, 10, 11, 12, or 13, further comprising: a gate, and a signal trench contact (TCN) on the device level extending across the first device and the second device in a direction generally orthogonal to the direction of the first power track and the second power track.

Example Embodiment 15 a method of fabricating a layout for an integrated circuit structure comprises forming a cell on a metal level, the cell defined by a cell boundary. A plurality of substantially parallel interconnect lines are formed inside the cell boundary. A first power track and a second power track are formed both dedicated to power and located completely inside the cell boundary without any power tracks along the cell boundary on the metal level.

Example Embodiment 16 the method of example embodiment 15, further comprising: forming block-level routing interconnects along opposite sides of the cell boundary on the metal level.

Example Embodiment 17 the method of example embodiment 15 or 16, further comprising: forming a device inside the cell boundary on a device level below the metal level. A power trench contact (TCN) is formed coupled to the device inside the cell boundary on the device level. A power via contact (VCT) is formed coupled between the power TCN and either the first power track or the second power track, wherein the power VCT is located inside the cell boundary on a via level between the metal level and the device level.

Example Embodiment 18 the method of example embodiment 15, 16 or 17, further comprising: forming a gate, and a signal trench contact (TCN) on the device level extending across the device in a direction generally orthogonal to the direction of the first power track and the power tracks.

Example Embodiment 19 the method of example embodiment 15, further comprising: forming the first power track as a Vss power track and forming the second power track as a Vcc power track.

Example Embodiment 20 the method of example embodiment 19, further comprising: locating the Vss power track adjacent to one of a top cell boundary (TCB) and a bottom cell boundary (BCB), and locating the Vcc power track adjacent to an opposite one of the cell boundaries.

Example Embodiment 21 the method of example embodiment 20, further comprising: forming interconnect lines between the Vss power track and the Vcc power track.

Example Embodiment 22 the method of example embodiment 15, 16, 17, 18, 19, 20, or 21, further comprising: forming the power VCT to land directly over the device.

Example Embodiment 23

A method of fabricating a layout for an integrated circuit structure comprises forming a first device and a second device are formed inside the cell boundary on a device level. A first power trench contact (TCN) is formed on the first device inside the cell boundary. A second power TCN is formed on the second the second device inside the cell boundary. A first power via contact (VCT) is formed on the first power TCN directly over the first device inside the cell boundary. A second power via contact (VCT) is formed on the second power TCN directly over the second device inside the cell boundary. A cell is formed on a metal level above the device level, wherein the cell is defined by a cell boundary and comprises a plurality of substantially parallel interconnect lines inside the cell boundary, and a first power track and a second power track both dedicated to power and located completely inside the cell boundary on the metal level.

Example Embodiment 24 the method of example embodiment 23, further comprising: forming block-level routing interconnects along opposite sides of the cell boundary on the metal level.

Example Embodiment 25 the method of example embodiment 23 or 2423, further comprising: forming the first power track as a Vss power track and forming the second power track as a Vcc power track.

What is claimed is:
1. An integrated circuit structure, comprising:
a cell on a metal level, the cell defined by a cell boundary;
a plurality of substantially parallel interconnect lines inside the cell boundary, wherein the plurality of substantially parallel interconnect lines comprise one or more signal tracks; and
a first power track and a second power track both dedicated to power and located completely inside the cell boundary without any power tracks along the cell boundary on the metal level, wherein the first and second power tracks are outermost ones of the plurality of substantially parallel interconnect lines, and wherein the one or more signal tracks are between the first and second power tracks without an additional power track intervening between the first and second power tracks.
2. The integrated circuit structure of claim 1, wherein the cell further includes block-level routing interconnects along opposite sides of the cell boundary on the metal level.

3. The integrated circuit structure of claim 1, further comprising
a device inside the cell boundary on a device level below the metal level;
a power trench contact (TCN) coupled to the device inside the cell boundary on the device level; and
a power via contact (VCT) coupled between the power TCN and either the first power track or the second power track, wherein the power VCT is located inside the cell boundary on a via level between the metal level and the device level.

4. The integrated circuit structure of claim 3, wherein the power VCT lands directly over the device.

5. The integrated circuit structure of claim 1, wherein the first power track comprises a Vss power track and the second power track comprises a Vcc power track.

6. The integrated circuit structure of claim 5, wherein the Vss power track is located adjacent to one of a top cell boundary (TCB) and a bottom cell boundary (BCB), and the Vcc power track is located adjacent to an opposite one of the cell boundaries.

7. The integrated circuit structure of claim 6, wherein the plurality of substantially parallel interconnect lines are located between the Vss power track and the Vcc power track.

8. An integrated circuit structure, comprising:
a cell on a metal level, the cell defined by a cell boundary;
a plurality of substantially parallel interconnect lines inside the cell boundary, wherein the plurality of substantially parallel interconnect lines comprise one or more signal tracks;
a first power track and a second power track both dedicated to power and located completely inside the cell boundary on the metal level, wherein the first and second power tracks are outermost ones of the plurality of substantially parallel interconnect lines, and wherein the one or more signal tracks are between the first and second power tracks without an additional power track intervening between the first and second power tracks;
a first device and a second device inside the cell boundary on a device level below the metal level;
a first power trench contact (TCN) coupled to the first device inside the cell boundary on the device level;
a second power TCN coupled on the second device inside the cell boundary on the device level;
a first power via contact (VCT) coupled between the first power TCN and the first power track, wherein the first power VCT is located inside the cell boundary and on a via level between the metal level and the device level; and
a second power via contact (VCT) coupled between the second power TCN and the second power track, wherein the second power VCT is located inside the cell boundary and on a via level between the metal level and the device level.

9. The integrated circuit structure of claim 8, wherein the cell further includes block-level routing interconnects along opposite sides of the cell boundary on the metal level.

10. The integrated circuit structure of claim 8, wherein the first power track comprise a Vss power track and the second power track comprises a Vcc power track.

11. The integrated circuit structure of claim 10, wherein the Vss power track is located adjacent to one of a top cell boundary (TCB) and a bottom cell boundary (BCB), and the Vcc power track is located adjacent to an opposite one of the cell boundaries.

12. The integrated circuit structure of claim 11, wherein interconnect lines are located between the Vss power track and the Vcc power track.

13. The integrated circuit structure of claim 8, wherein the first power VCT lands directly over the first device, and the second power VCT lands directly over the second device.

14. The integrated circuit structure of claim 8, further comprising: a gate, and a signal trench contact (TCN) on the device level extending across the first device and the second device in a direction generally orthogonal to the direction of the first power track and the second power track.

15. A method of fabricating a layout for an integrated circuit structure, the method comprising:
forming a cell on a metal level, the cell defined by a cell boundary;
forming a plurality of substantially parallel interconnect lines inside the cell boundary, wherein the plurality of substantially parallel interconnect lines comprise one or more signal tracks; and
forming a first power track and a second power track both dedicated to power and located completely inside the cell boundary without any power tracks along the cell boundary on the metal level, wherein the first and second power tracks are outermost ones of the plurality of substantially parallel interconnect lines, and wherein the one or more signal tracks are between the first and second power tracks without an additional power track intervening between the first and second power tracks.

16. The method of claim 15, further comprising: forming block-level routing interconnects along opposite sides of the cell boundary on the metal level.

17. The method of claim 15, further comprising:
forming a device inside the cell boundary on a device level below the metal level;
forming a power trench contact (TCN) coupled to the device inside the cell boundary on the device level; and
forming a power via contact (VCT) coupled between the power TCN and either the first power track or the second power track, wherein the power VCT is located inside the cell boundary on a via level between the metal level and the device level.

18. The method of claim 17, further comprising: forming a gate, and a signal trench contact (TCN) on the device level extending across the device in a direction generally orthogonal to the direction of the first power track and the second power track.

19. The method of claim 15, further comprising: forming the first power track as a Vss power track and forming the second power track as a Vcc power track.

20. The method of claim 19, further comprising: locating the Vss power track adjacent to one of a top cell boundary (TCB) and a bottom cell boundary (BCB), and locating the Vcc power track adjacent to an opposite one of the cell boundaries.

21. The method of claim 20, further comprising: forming interconnect lines between the Vss power track and the Vcc power track.

22. The method of claim 17, further comprising: forming the power VCT to land directly over the device.

23. A method of fabricating a layout for an integrated circuit structure, the method comprising:
forming a first device and a second device inside a cell boundary on a device level;
forming a first power trench contact (TCN) on the first device inside the cell boundary;
forming a second power TCN on the second device inside the cell boundary;

forming a first power via contact (VCT) on the first power TCN directly over the first device inside the cell boundary and;

forming a second power via contact (VCT) on the second power TCN directly over the second device inside the cell boundary; and forming a cell on a metal level above the device level, wherein the cell is defined by the cell boundary and comprises a plurality of substantially parallel interconnect lines inside the cell boundary, wherein the plurality of substantially parallel interconnect lines comprise one or more signal tracks, and a first power track and a second power track both dedicated to power and located completely inside the cell boundary on the metal level, wherein the first and second power tracks are outermost ones of the plurality of substantially parallel interconnect lines, and wherein the one or more signal tracks are between the first and second power tracks without an additional power track intervening between the first and second power tracks.

24. The method of claim 23, further comprising: forming block-level routing interconnects along opposite sides of the cell boundary on the metal level.

25. The method of claim 23, further comprising: forming the first power track as a Vss power track and forming the second power track as a Vcc power track.

* * * * *